(12) United States Patent
Yeh et al.

(10) Patent No.: US 12,557,698 B2
(45) Date of Patent: Feb. 17, 2026

(54) PACKAGE AND MANUFACTURING METHOD THEREOF

(71) Applicant: Taiwan Semiconductor Manufacturing Company, Ltd., Hsinchu (TW)

(72) Inventors: Der-Chyang Yeh, Hsin-Chu (TW); Sung-Feng Yeh, Taipei (TW); Jian-Wei Hong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 736 days.

(21) Appl. No.: 17/872,007

(22) Filed: Jul. 25, 2022

(65) Prior Publication Data

US 2024/0030186 A1    Jan. 25, 2024

(51) Int. Cl.
| | |
|---|---|
| *H01L 25/065* | (2023.01) |
| *H01L 21/56* | (2006.01) |
| *H01L 23/00* | (2006.01) |
| *H01L 25/04* | (2023.01) |
| *H01L 25/07* | (2006.01) |
| *H01L 25/075* | (2006.01) |

(52) U.S. Cl.
CPC .......... *H01L 25/0657* (2013.01); *H01L 21/56* (2013.01); *H01L 24/19* (2013.01); *H01L 24/24* (2013.01); *H01L 24/80* (2013.01); *H01L 25/043* (2013.01); *H01L 25/074* (2013.01); *H01L 25/0756* (2013.01); *H01L 2224/24011* (2013.01); *H01L 2224/80895* (2013.01)

(58) Field of Classification Search
CPC . H01L 25/043; H01L 25/0657; H01L 25/074; H01L 25/0756; H01L 2225/06541
See application file for complete search history.

(56) References Cited

U.S. PATENT DOCUMENTS

| | | | |
|---|---|---|---|
| 7,812,459 B2 * | 10/2010 | Yu | ........................ H01L 25/0652 |
| | | | 257/E21.511 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,620,488 B2 * | 4/2017 | Yu | ..................... H01L 21/76898 |
| 9,666,502 B2 | 5/2017 | Chen et al. | |
| 9,735,131 B2 | 8/2017 | Su et al. | |

(Continued)

*Primary Examiner* — David A Zarneke
(74) *Attorney, Agent, or Firm* — JCIPRNET

(57) ABSTRACT

A manufacturing method of a package is provided. The method includes the following steps. A wafer substrate having first bonding pads is provided. A die is placed on the wafer substrate, wherein the die comprises second bonding pads bonded to the first bonding pads. The die is encapsulated by an etch stop layer and a first encapsulant. A redistribution structure is disposed over the die, the etch stop layer and the first encapsulant. A portion of the redistribution structure is removed to expose the first encapsulant. The first encapsulant is removed to expose the etch stop layer. A dielectric structure is disposed over the exposed etch stop layer and laterally encapsulates the die and the redistribution structure.

20 Claims, 21 Drawing Sheets

(56) References Cited

U.S. PATENT DOCUMENTS

| | | | | |
|---|---|---|---|---|
| 10,937,743 B2* | 3/2021 | Chen | ................... | H01L 21/568 |
| 11,031,354 B2* | 6/2021 | Chen | ................... | H01L 24/19 |
| 11,063,019 B2* | 7/2021 | Chen | ................... | H01L 23/5283 |
| 2022/0367364 A1* | 11/2022 | Jeon | ................... | H01L 23/5386 |

* cited by examiner

PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
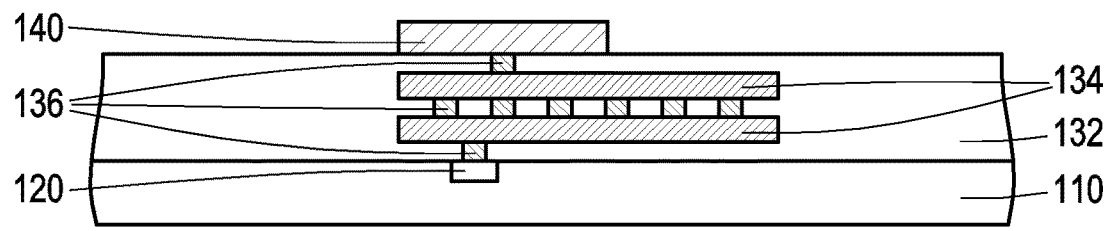
FIG. 1A to FIG. 1O are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1O are schematic cross-sectional views illustrating a manufacturing process of a package 10 in accordance with some embodiments of the disclosure. It is understood that the disclosure is not limited by the method described below. Additional operations can be provided before, during, and/or after the method and some of the operations described below can be replaced or eliminated, for additional embodiments of the methods. In exemplary embodiments, the following manufacturing process is part of a wafer level packaging process. In detail, one package is shown to represent plural packages obtained following the manufacturing process. That is to say, a single package region is illustrated in FIGS. 1A-1O, and the package 10 (see FIG. 1O) is formed in the illustrated package region.

Referring to FIG. 1A, a semiconductor substrate 110 is provided. The semiconductor substrate 110 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The semiconductor substrate 110 may be a bulk silicon substrate, a silicon-on-insulator (SOI) substrate, or a germanium-on-insulator (GOI) substrate. In some embodiments, the semiconductor substrate 110 has a device 120 formed therein. The device 120 may include active components (e.g., transistors or the like) and/or passive components (e.g., resistors, capacitors, inductors, or the like). For simplicity, one device 120 is shown in FIG. 1A. However, it should be understood that more than one device 120 may be formed in the semiconductor substrate 110.

As illustrated in FIG. 1A, an interconnection structure 130 is formed on the semiconductor substrate 110. In some embodiments, the interconnection structure 130 includes a dielectric layer 132, a plurality of conductive patterns 134, and a plurality of conductive vias 136. For simplicity, the dielectric layer 132 is illustrated as a single dielectric layer and the conductive patterns 134 are illustrated as embedded in the dielectric layer 132. Nevertheless, from the perspective of the manufacturing process, the dielectric layer 132 is constituted by at least two dielectric layers, and the conductive patterns 134 are sandwiched between two adjacent dielectric layers. In some embodiments, the conductive patterns 134 located at different level heights are connected with each other through the conductive vias 136. In other words, the conductive patterns 134 are electrically connected with each other through the conductive vias 136. In some embodiments, the bottommost conductive via 136 is connected with the device 120 embedded in the semiconductor substrate 110. In other words, the bottommost conductive via 136 establishes electrical connection between the device 120 and the conductive patterns 134 of the interconnection structure 130. In some embodiments, the bottommost conductive via 136 may be referred to as "contact structure" of the device 120.

In some embodiments, the material of the dielectric layer 132 includes polyimide, epoxy resin, acrylic resin, phenol resin, benzocyclobutene (BCB), polybenzooxazole (PBO), or any other suitable polymer-based dielectric material. The dielectric layer 132, for example, may be formed by suitable fabrication techniques such as a spin-coating process, chemical vapor deposition (CVD), plasma-enhanced chemical vapor deposition (PECVD), or the like. In some embodiments, the material of the conductive patterns 134 and the conductive vias 136 include aluminum, titanium, copper, nickel, tungsten, or alloys thereof. The conductive patterns 134 and the conductive vias 136 may be formed by, for example, electroplating, deposition, and/or photolithography and etching. In some embodiments, the conductive patterns 134 and the underlying conductive vias 136 may be formed simultaneously. It should be noted that the number of the dielectric layers 132, the number of the conductive patterns 134, and the number of the conductive vias 136 illustrated in FIG. 1A are merely for illustrative purposes, and the disclosure is not limited thereto. In some alternative embodiments, fewer or more layers of the dielectric layers 132, the conductive patterns 134, or the conductive vias 136 may be formed depending on the circuit design.

As illustrated in FIG. 1A, a conductive pad 140 is formed over the interconnection structure 130. In some embodiments, the conductive pad 140 is electrically connected with the conductive patterns 134 of the interconnection structure 130 through the topmost conductive via 136. In some embodiments, the conductive pad 140 is used to establish electrical connection with other components (not shown) or dies (not shown) subsequently formed or provided. In some alternative embodiments, the conductive pad 140 may be a test pad used to probe the subsequently formed wafer substrate WS (shown in FIG. 1C) in which the conductive pad 140 is included. In some embodiments, the conductive pad 140 may be an aluminum pad, a copper pad, or other suitable metal pad. For simplicity, one conductive pad 140 is shown in FIG. 1A. However, it should be understood that more than one conductive pad 140 may be formed over the interconnection structure 130. The number and shape of the conductive pad 140 may be selected based on demand.

Figure 1B:
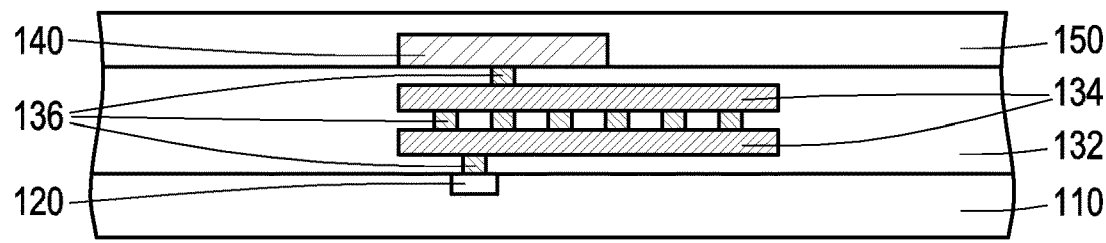

Referring to FIG. 1B, a passivation layer 150 is formed over the interconnection structure 130 and the conductive pad 140. In some embodiments, the material of the passivation layer 150 includes oxides, such as silicon oxide or the like. Alternatively, the passivation layer 150 may include polyimide, epoxy resin, acrylic resin, phenol resin, BCB, PBO, or any other suitable polymer-based dielectric material. The passivation layer 150, for example, may be formed by suitable fabrication techniques, such as a spin-coating process, CVD, PECVD, or the like.

Figure 1C:
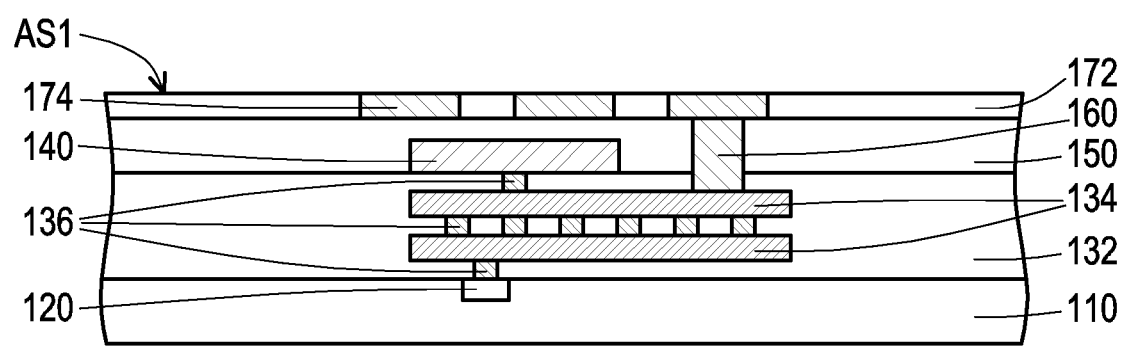

Referring to FIG. 1C, a bonding via 160 and a bonding layer 170 are formed to obtain a wafer substrate WS. As illustrated in FIG. 1C, the bonding via 160 is formed to penetrate through the passivation layer 150 and at least part of the dielectric layer 132 of the interconnection structure 130 to establish electrical connection with the conductive patterns 134 of the interconnection structures 130. For simplicity, one bonding via 160 is shown in FIG. 1C. However, it should be understood that more than one bonding via 160 may be formed over the semiconductor substrate 110.

The bonding layer 170 is formed over the passivation layer 150 and the bonding via 160. In some embodiments, the bonding layer 170 includes a dielectric layer 172 and a plurality of bonding pad 174. In some embodiments, the bonding pads 174 are embedded in the dielectric layer 172. In some embodiments, at least one of the bonding pads 174 of the bonding layer 170 is electrically connected with the bonding via 160. That is, the bonding via 160 electrically connects the interconnection structure 130 with the bonding pads 174. For simplicity, because one bonding via 160 is shown in FIG. 1C, one bonding pad 174 in directly contact with the bonding via 160 is shown in FIG. 1C. However, it should be understood that if more than one bonding via 160 are formed over the semiconductor substrate 110, more than one bonding pad 174 may be formed to be electrically connected and in contact with the more than one bonding via 160.

In some embodiments, the bonding via 160 and the bonding pads 174 may be formed via a dual damascene process. For example, the dielectric layer 172 is first formed on the passivation layer 150. In some embodiments, the material of the dielectric layer 172 includes oxides, such as silicon oxide or the like. Alternatively, the dielectric layer 172 may include polyimide, epoxy resin, acrylic resin, phenol resin, BCB, PBO, or any other suitable polymer-based dielectric material. The dielectric layer 172, for example, may be formed by suitable fabrication techniques, such as a spin-coating process, CVD, PECVD, or the like. Subsequently, trenches and a via hole (not shown) are formed in the dielectric layer 172 and the passivation layer 150 by removing portions of theses layers. In some embodiments, the width of the trench is greater than the width of the via hole. Thereafter, a conductive material (not shown) is filled into the via hole to form the bonding via 160. Meanwhile, the conductive material (not shown) also fills into the trenches to from the bonding pads 174. That is, the bonding via 160 and the bonding pads 174 are formed by simultaneously filling the via hole and the overlying trenches (not shown). However, the disclosure is not limited thereto. In some alternative embodiments, the bonding via 160 may be formed before the dielectric layer 172 and the bonding pads 174. In some embodiments, the width of each bonding pad 174 may be greater than the width of the underlying bonding via 160. In some embodiments, the bonding via 160 and the bonding pads 174 include the same material. For example, the bonding via 160 and the bonding pads 174 may be made of aluminum, titanium, copper, nickel, tungsten, or alloys thereof.

In some embodiments, the top surface of the dielectric layer 172 and the top surfaces of the bonding pads 174 may be collectively referred to as an active surface AS1 of the wafer substrate WS. As shown in FIG. 1C, the top surface of the dielectric layer 172 and the top surfaces of the bonding pads 174 are substantially located at the same level height to provide an appropriate active surface AS1 for hybrid bonding. In other words, the top surface of the dielectric layer 172 is substantially leveled (e.g., coplanar) with the top surfaces of the bonding pads 174.

Although not illustrated, in some embodiments, at least one bonding via 160 may be disposed directly above the conductive pad 140 to establish electrical connection between the conductive pad 140 and other elements (for example, the bonding pads 174 directly above the conductive pad 140). That is, in some embodiments, some of the conductive pads 140 are electrically floating while some of the conductive pads 140 are able to transmit signal.

Figure 1D:
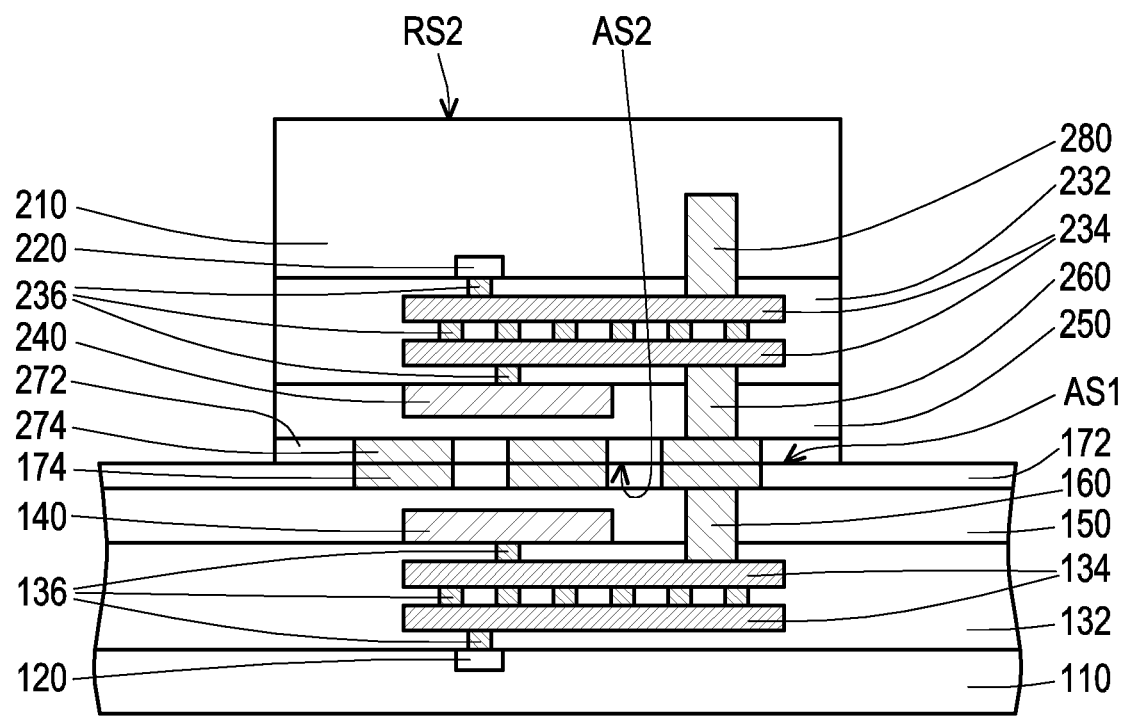

Referring to FIG. 1D, a die 200 is provided. In some embodiments, the die 200 includes a semiconductor substrate 210, a device 220, an interconnection structure 230, a conductive pad 240, a passivation layer 250, a bonding via 260, a bonding layer 270, and a through semiconductor via (TSV) 280. In some embodiments, the device 220 is formed in the semiconductor substrate 210. The semiconductor substrate 210 and the device 220 in die 200 are respectively similar to the semiconductor substrate 110 and the device 110 in the wafer substrate WS, so the detailed descriptions thereof are omitted herein.

As illustrated in FIG. 1D, the interconnection structure 230 is disposed on the semiconductor substrate 210. In some embodiments, the interconnection structure 230 is electrically connected with the device 220 formed in the semiconductor substrate 210. In some embodiments, the interconnection structure 230 includes a dielectric layer 232, a plurality of conductive patterns 234, and a plurality of conductive vias 236. The dielectric layer 232, the conductive patterns 234, and the conductive vias 236 of the interconnection structure 230 are respectively similar to the dielectric layer 132, the conductive patterns 134, and the conductive vias 136 of the interconnection structure 130, so the detailed descriptions thereof are omitted herein.

In some embodiments, the conductive pad 240, the passivation layer 250, and the bonding via 260 are formed over the interconnection structure 230. In some embodiments, the conductive pad 240, the passivation layer 250, and the bonding via 260 of the die 200 are respectively similar to the conductive pad 140, the passivation layer 150, and the bonding via 160 of the wafer substrate WS, so the detailed descriptions thereof are omitted herein. In some embodiments, the conductive pad 240 is electrically connected with the interconnection structure 230. In some embodiments, the bonding via 260 is formed to penetrate through the passivation layer 250 and at least part of the dielectric layer 232 of the interconnection structure 230 to establish electrical connection with the conductive patterns 234 of the interconnection structures 230. That is, a portion of the bonding via 260 is embedded in the passivation layer 250 and another portion of the bonding via 260 is embedded in the dielectric layer 232 of the interconnection structure 230.

As illustrated in FIG. 1D, the bonding layer 270 is formed over the passivation layer 250 and the bonding via 260. In some embodiments, the bonding layer 270 includes a dielectric layer 272 and a plurality of bonding pads 274. The dielectric layer 272 and the bonding pads 274 of the bonding layer 270 are respectively similar to the dielectric layer 172 and the bonding pads 174 of the bonding layer 170, so the detailed descriptions thereof are omitted herein. In some embodiments, the bonding via 260 is electrically connected with and in directly contact with the bonding pad 274. That is, the bonding via 260 electrically connects the interconnection structure 230 with the bonding pad 274.

In some embodiments, the TSV 280 is embedded in the semiconductor substrate 210 and the dielectric layer 232 of the interconnection structure 230. That is, the TSV 280 extends from the semiconductor substrate 210 to the interconnection structure 230. For example, a portion of the TSV 280 is embedded in the semiconductor substrate 210 while another portion of the TSV 280 is embedded in the dielectric layer 232 of the interconnection structure 230. In some embodiments, the TSV 280 is directly in contact with the conductive pattern 234 to render electrical connection with the interconnection structure 230. For simplicity, one TSV 280 is shown in FIG. 1D. However, it should be understood that the die 200 may include more than one TSV 280.

In some embodiments, the die 200 may be capable of performing storage functions. For example, the die 200 may be Dynamic Random Access Memory (DRAM), Resistive Random Access Memory (RRAM), Static Random Access Memory (SRAM), or the like. However, the disclosure is not limited thereto. In some alternative embodiments, the die 200 may be Central Process Unit (CPU) dies, Graphic Process Unit (GPU) dies, Field-Programmable Gate Array (FPGA), or the like.

As illustrated in FIG. 1D, the bottom surfaces of the bonding pads 274 and the bottom surface of the dielectric layer 272 may be collectively referred to as an active surface AS2 of the die 200. On the other hand, the surface of the die 200 opposite to the active surface AS2 may be referred to as a rear surface RS2 of the die 200. As shown in FIG. 1D, the bottom surfaces of the bonding pads 274 and the bottom surface of the dielectric layer 272 are substantially located at the same level height to provide an appropriate active surface AS2 for hybrid bonding. In other words, the bottom surface of the dielectric layer 272 is substantially leveled (e.g., coplanar) with the bottom surfaces of the bonding pads 274.

As illustrated in FIG. 1D, the die 200 is placed on the wafer substrate WS such that the die 200 is bonded to the wafer substrate WS. For simplicity, one die 200 is shown in FIG. 1D. However, it should be understood that more than one die 200 may be bonded to the wafer substrate WS. In some embodiments, the die 200 may be bonded to the wafer substrate WS through a hybrid bonding process. In some embodiments, the temperature of the hybrid bonding process ranges from about 150° C. to about 400° C. The hybrid bonding process will be described in detail below.

In some embodiments, the die 200 may be picked-and-placed onto the active surface AS1 of the wafer substrate WS such that the die 200 is electrically connected with the wafer substrate WS. In some embodiments, the die 200 is placed such that the active surface AS2 of the die 200 is in contact with the active surface AS1 of the wafer substrate WS. Meanwhile, the bonding pads 274 of the die 200 are substantially aligned and in directly contact with the corresponding bonding pads 174 of the wafer substrate WS. In some embodiments, to facilitate the hybrid bonding between the die 200 and the wafer substrate WS, surface preparation for bonding surfaces (i.e., the active surface AS1 and the active surface AS2) of the wafer substrate WS and the die 200 may be performed. The surface preparation may include surface cleaning and activation, for example. Surface cleaning may be performed on the active surfaces AS1, AS2 to remove particles on the bonding surface of the dielectric layer 172, the bonding surfaces of the bonding pads 174, the bonding surface of the dielectric layer 272, and the bonding surfaces of the bonding pads 274. In some embodiments, the active surfaces AS1, AS2 may be cleaned by wet cleaning, for example. Not only particles are removed, but also native oxide formed on the bonding surfaces of the bonding pads 174 and the bonding pads 274 may be removed. The native oxide formed on the bonding surfaces of the bonding pads 174 and the bonding pads 274 may be removed by chemicals used in wet cleaning processes, for example.

After cleaning the active surfaces AS1 of the wafer substrate WS and the active surfaces AS2 of the die 200, activation of the bonding surfaces of the dielectric layer 172 and the dielectric layer 272 may be performed for development of high bonding strength. In some embodiments, plasma activation may be performed to treat the bonding surfaces of the dielectric layer 172 and the dielectric layer 272. When the activated bonding surface of the dielectric layer 172 is in contact with the activated bonding surface of the dielectric layer 272, the dielectric layer 172 of the wafer substrate WS and the dielectric layer 272 of the die 200 are pre-bonded.

After pre-bonding the die 200 onto the wafer substrate WS, hybrid bonding of the die 200 and the wafer substrate WS is performed. The hybrid bonding of the die 200 and the wafer substrate WS may include a thermal treatment for dielectric bonding and a thermal annealing for conductor bonding. In some embodiments, the thermal treatment for dielectric bonding is performed to strengthen the bonding between the dielectric layer 172 and the dielectric layer 272. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the bonding pads 174 and the bonding pads 274. For example, the thermal annealing for conductor bonding may be performed at temperature ranging from about 150° C. to about 400° C. After performing the thermal annealing for conductor bonding, the dielectric layer 172 is hybrid bonded to the dielectric layer 272 and the bonding pads 174 are hybrid bonded to the bonding pads 274. For example, the dielectric layer 172 is directly in contact with the dielectric layer 272. Similarly, the bonding pads 174 are directly in contact with the bonding pads 274. As such, the bonding layer 170 of the wafer substrate WS is hybrid bonded to the bonding layer 270 of the die 200. Although FIG. 1D illustrated that the bonding pads 174 and the bonding pads 274 have sharp corners (the sidewalls are perpendicular to the top/bottom surfaces), the disclosure is not limited thereto. In some alternative embodiments, after the bonding pads 174 are hybrid bonded to the bonding pads 274, corner rounding of the bonding pads may occur. For example, the corners of the bonding pads 174 facing the bonding pads 274 are rounded. Similarly, the corners of the bonding pads 274 facing the bonding pads 174 are also rounded. That is, edges of the top surface of each bonding pad 174 are rounded. Similarly, edges of the bottom surface of each bonding pad 274 are also rounded. Moreover, although FIG. 1D illustrated that the bonding pads 174 and the bonding pads 274 have the same width and sidewalls of the bonding pads 174 are aligned with sidewalls of the bonding pads 274, the disclosure is not limited thereto. In some alternative embodiments, the width of each bonding pad 174 may be smaller than or larger than the width of each bonding pad 274.

In some embodiments, since the wafer substrate WS is in wafer form and the die 200 is in chip form, the hybrid bonding process in FIG. 1D may be referred to as a "chip-on-wafer bonding process." In some embodiments, since the active surface AS1 of the wafer substrate WS are hybrid bonded to the active surface AS2 of the die 200, the bonding between the wafer substrate WS and the die 200 may be considered as face-to-face bonding.

Figure 1E:
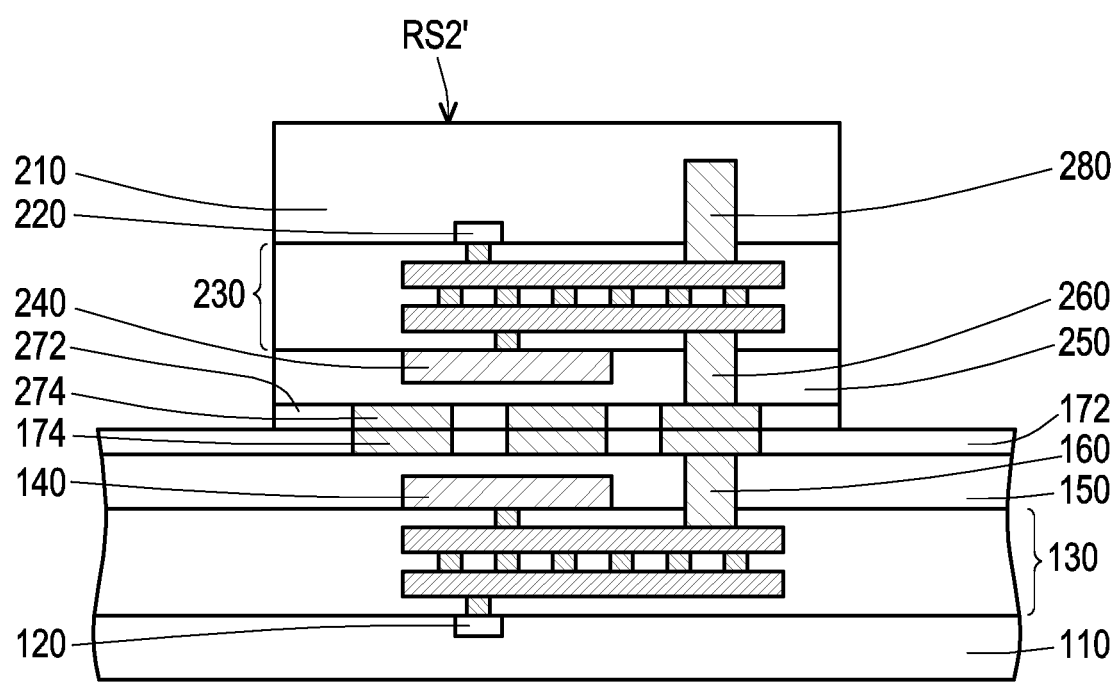

Referring to FIG. 1E, the semiconductor substrate 210 is thinned down from the rear surface RS2 of the die 200 through a thinning down process. In detail, a portion of the semiconductor substrate 210 is removed to reduce the overall thickness of the semiconductor substrate 210. From another point of view, after the thinning down process, a rear surface RS2' of the die 200 is closer to the TSV 280. In some embodiments, the thinning down process includes a mechanical grinding process, a chemical mechanical polishing (CMP) process, an etching process or a combination thereof.

Figure 1F:
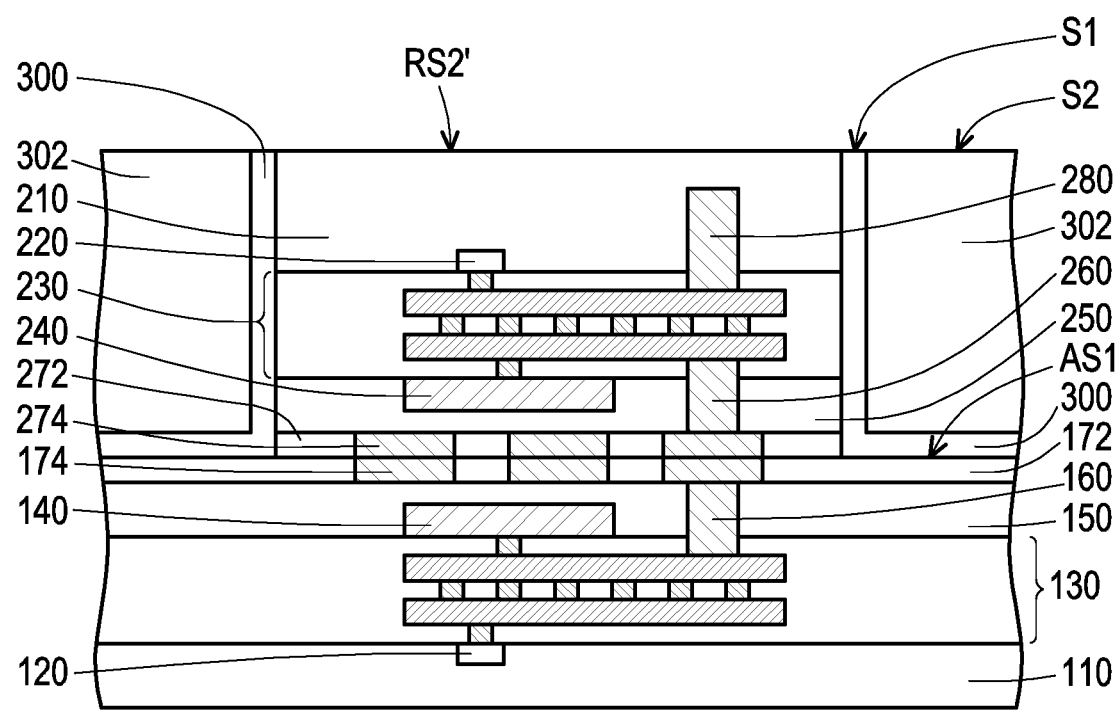

Referring to FIG. 1F, an etch stop layer 300 and an encapsulant 302 are formed over the wafer substrate WS to laterally encapsulate the die 200. As shown in FIG. 1F, the etch stop layer 300 is disposed between the die 200 and the encapsulant 302, and between the wafer substrate WS and the encapsulant 302. In some embodiments, the etch stop layer 300 and the encapsulant 302 may be formed by the following steps. First, an etch stop material layer (not shown) is conformally formed on the wafer substrate WS and the die 200 by any suitable deposition method such as PVD, CVD, or the like. At this stage, the etch stop material layer may cover the top surface of the dielectric layer 172 (i.e., the active surface AS1 of the wafer substrate WS), and the sidewalls and the rear surface RS2' of the die 200. The etch stop material layer may include or be SiN, while other materials (e.g., $Al_2O_3$, AlN, SiON, SiOC, SiOCN, or the like) may be used. Next, an encapsulation material layer (not shown) is formed over the etch stop material layer to encapsulate the die 200. At this stage, the semiconductor substrate 210 of the die 200 is not revealed and is well protected by the encapsulation material layer. For example, the rear surface RS2' of the die 200 is not revealed. From another point of view, at this stage, the portion of the etch stop material layer on the rear surface RS2' of the die 200 is also not revealed. In some embodiments, the encapsulation material layer may be formed by a spin-coating process, a CVD process, a PECVD process, an atomic layer deposition (ALD) process, or the like. In some embodiments, the encapsulation material layer includes or is silicon oxide, and/or tetraethoxysilane (TEOS). As such, the encapsulant 300 is referred to as "gap fill oxide." After the encapsulation material layer is formed, the etch stop material layer and the encapsulation material layer are thinned until the rear surface RS2' of the die 200 is exposed, so as to form the etch stop layer 300 and the encapsulant 302 aside the die 200. In some embodiments, the etch stop material layer and the encapsulation material layer may be thinned or planarized through a grinding process, such as a mechanical grinding process, a CMP process, or the like. After the removal process, as illustrated in FIG. 1F, the rear surface RS2' of the die 200 is substantially coplanar or flush with the illustrated top surface S1 of the etch stop layer 300 and the illustrated top surface S2 of the encapsulant 302. In some embodiments, the encapsulant 302 further includes fillers. Alternatively, the encapsulant 302 may be free of fillers.

Figure 1G:
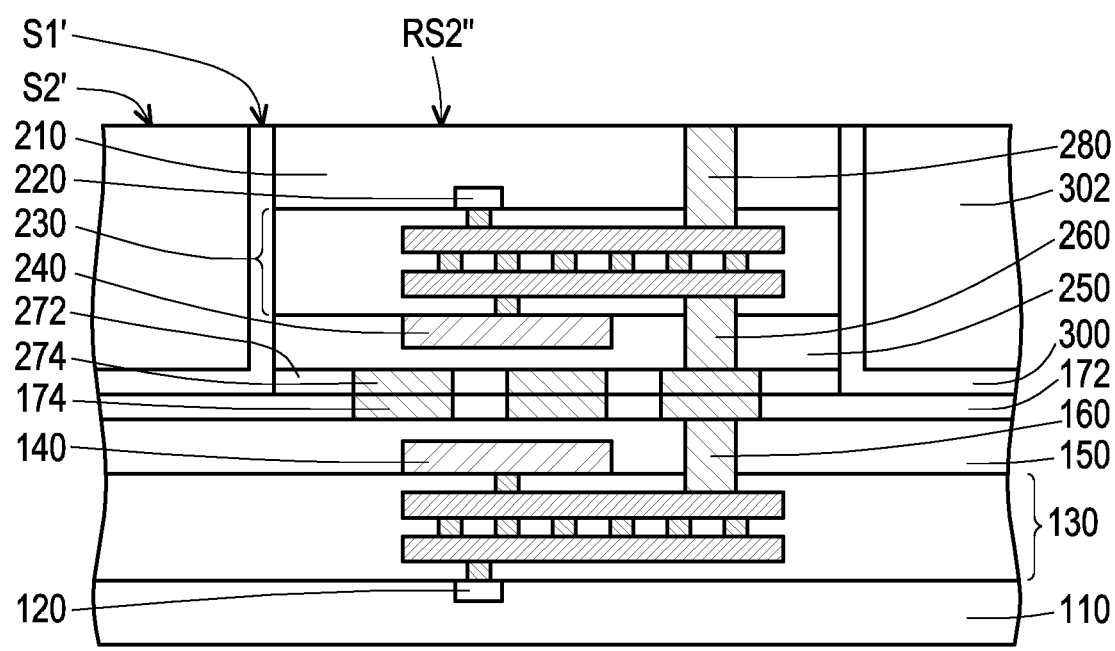

Referring to FIG. 1G and FIG. 1F, after the etch stop layer 300 and the encapsulant 302 are formed, the die 200, the etch stop layer 300 and the encapsulant 300 are further thinned down until the TSV 280 is exposed by another thinning down process. That is, the die 200 is further thinned down from the rear surface RS2'. In some embodiments, the another thinning down process includes a mechanical grinding process, a CMP process, an etching process or a combination thereof. In some embodiments, after the TSV 280 is exposed, the die 200, the etch stop layer 300 and the encapsulant 302 may be further thinned down to reduce the overall thickness of the die 200. After the another thinning down process, a rear surface RS20" of the die 200 is substantially coplanar with a top surface S1' of the etch stop layer 300 and a top surface S2' of the encapsulant 302. As illustrated in FIG. 1G, after the another thinning down process, the TSV 280 penetrates through the semiconductor substrate 210 of the die 200 and exposed at the rear surface RS20" of the die 200.

Figure 1H:
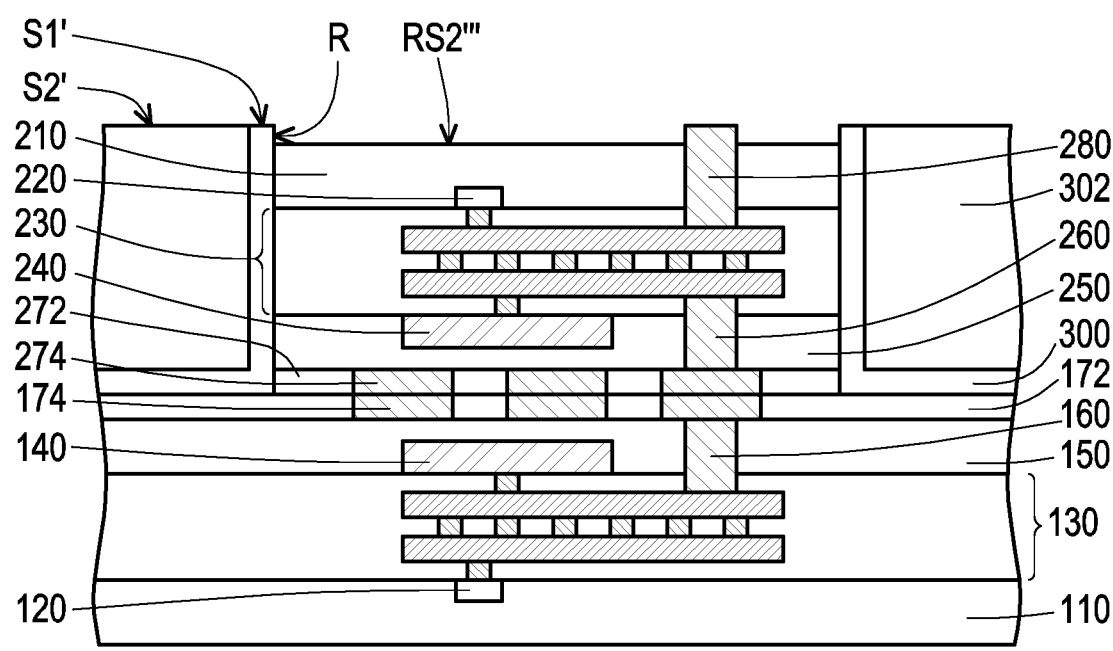

Referring to FIG. 1H, a portion of the die 200 is removed to form a recess R. In detail, a portion of the semiconductor substrate 210 of the die 200 is removed to form the recess R. As illustrated in FIG. 1H, the TSV 280 is partially located in the recess R. In some embodiments, at least a portion of the TSV 280 protrudes from the semiconductor substrate 210 of the die 200. That is, after the formation of the recess R, a rear surface RS2''' of the die 200 is located at a level lower than the illustrated top surface of the TSV 280, the illustrated top surface S1' of the etch stop layer 300 and the illustrated top surface S2' of the encapsulant 302. In some embodiments, the semiconductor substrate 210 may be partially removed through an etching process. The etching process includes, for example, an isotropic etching process and/or an anisotropic etching process. For example, the semiconductor substrate 210 may be partially removed through a wet etching process, a dry etching process, or a combination thereof.

Figure 1I:
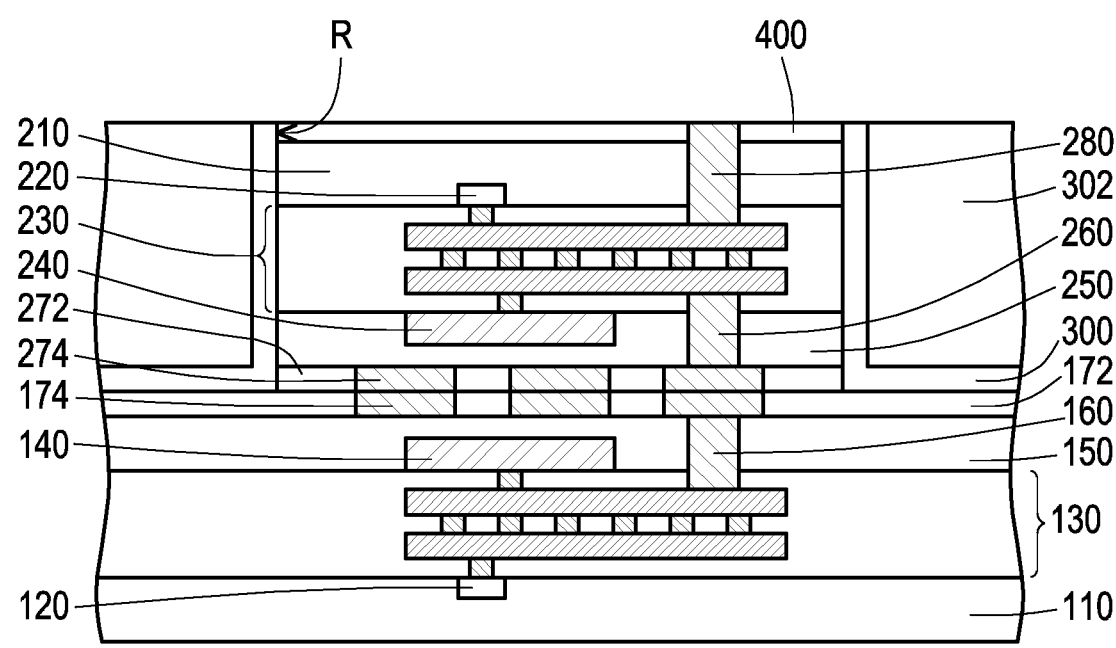

Referring to FIG. 1H and FIG. 1I, a protection layer 400 is formed to fill the recess R. In some embodiments, the protection layer 400 includes a molding compound, a molding underfill, or the like. Alternatively, the protection layer 400 may be made of a polymeric material, such as polyimide, epoxy resin, acrylic resin, phenol resin, BCB, PBO, or other suitable polymer-based dielectric materials. In some embodiments, the protection layer 400 may include fillers. Alternatively, the protection layer 400 may be free of fillers. As illustrated in FIG. 1I, the protruding portion of the TSV 280 is laterally encapsulated by the protection layer 400. In some embodiments, the protection layer 400 may be formed by the following steps. First, a protection material layer (not shown) is formed in the recess R and over the etch stop layer 300 and the encapsulant 302. Subsequently, a grinding or thinning down process is performed on the protection material layer until the TSV 280 is revealed. The thinning down process includes, for example, a mechanical grinding process, a CMP process, or the like. As illustrated in FIG. 1I, the etch stop layer 300 and the encapsulant 302 laterally encapsulates the protection layer 400.

Figure 1J:
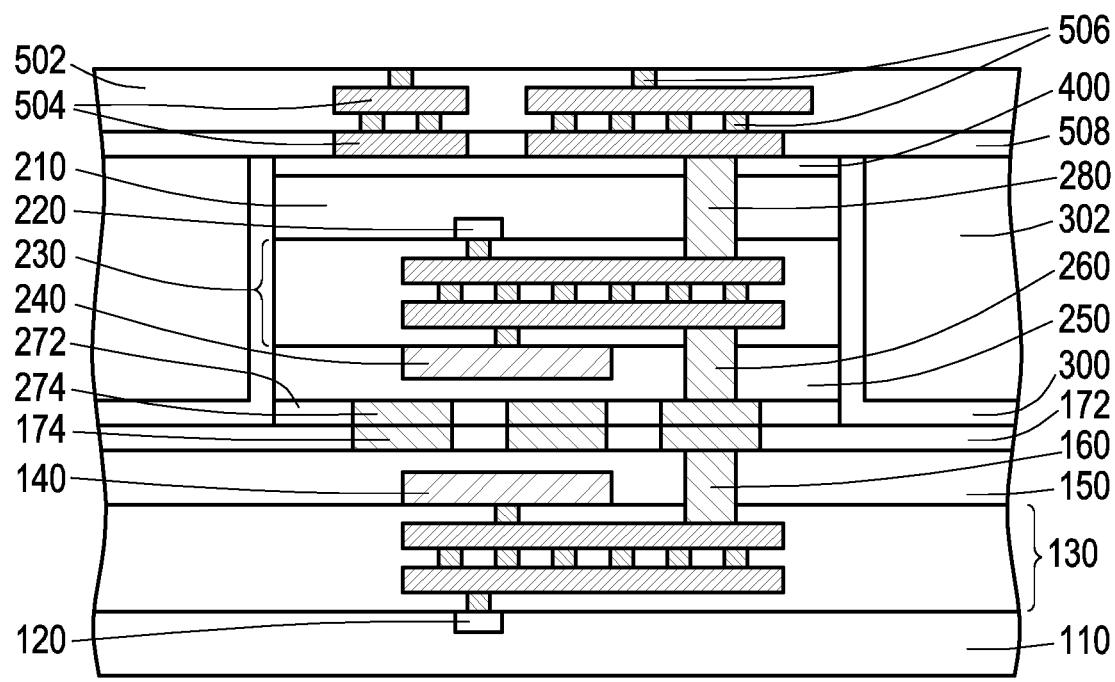

Referring to FIG. 1J, a redistribution structure 500 is formed over the die 200, the etch stop layer 300, the encapsulant 302, and the protection layer 400. In some embodiments, the redistribution structure 500 includes a dielectric layer 502, a plurality of conductive patterns 504, a plurality of conductive vias 506, and an etch stop layer 508. For simplicity, the dielectric layer 502 is illustrated as a single dielectric layer and some conductive patterns 504 are illustrated as embedded in the dielectric layer 502. Nevertheless, from the perspective of the manufacturing process, the dielectric layer 502 is constituted by at least two dielectric layers, and some conductive patterns 504 are sandwiched between two adjacent dielectric layers. As shown in FIG. 1J, the bottommost conductive patterns 504 are embedded in and laterally surrounded by the etch stop layer 508. From another point of view, the etch stop layer 508 is in directly contact with the etch stop layer 300 and the encapsulant 302, and the dielectric layer 502 is formed and disposed on the etch stop layer 508. In some embodiments, the conductive patterns 504 located at different level heights are connected with each other through the conductive vias 506. In other words, the conductive patterns 504 are electrically connected with each other through the conductive vias 506. In some embodiments, the bottommost conductive pattern 504 is directly in contact with the TSV 280 of the die 200. In other words, the redistribution structure 500 is electrically connected with the die 200.

In some embodiments, the material of the etch stop layer 508 includes SiN, while other materials (e.g., $Al_2O_3$, AlN, SiON, SiOC, SiOCN, or the like) may be used. The etch stop layer 508, for example, may be formed by suitable fabrication techniques such as PVD, CVD, or the like. In some embodiments, the material of the dielectric layer 502 includes polyimide, epoxy resin, acrylic resin, phenol resin, BCB, PBO, or any other suitable polymer-based dielectric material. The dielectric layer 502, for example, may be formed by suitable fabrication techniques such as a spin-coating process, CVD, PECVD, or the like. In some embodiments, the material of the conductive patterns 504 and the conductive vias 506 includes aluminum, titanium, copper, nickel, tungsten, or alloys thereof. The conductive patterns 504 and the conductive vias 506 may be formed by, for example, electroplating, deposition, and/or photolithography and etching. In some embodiments, the conductive patterns 504 and the underlying conductive vias 506 may be formed simultaneously. It should be noted that the number of the dielectric layers 502, the number of the conductive patterns 504, and the number of the conductive vias 506 illustrated in FIG. 1J are merely for illustrative purposes, and the disclosure is not limited thereto. In some alternative embodiments, fewer or more layers of the dielectric layers 502, the conductive patterns 504, or the conductive vias 506 may be formed depending on the circuit design.

Figure 1K:
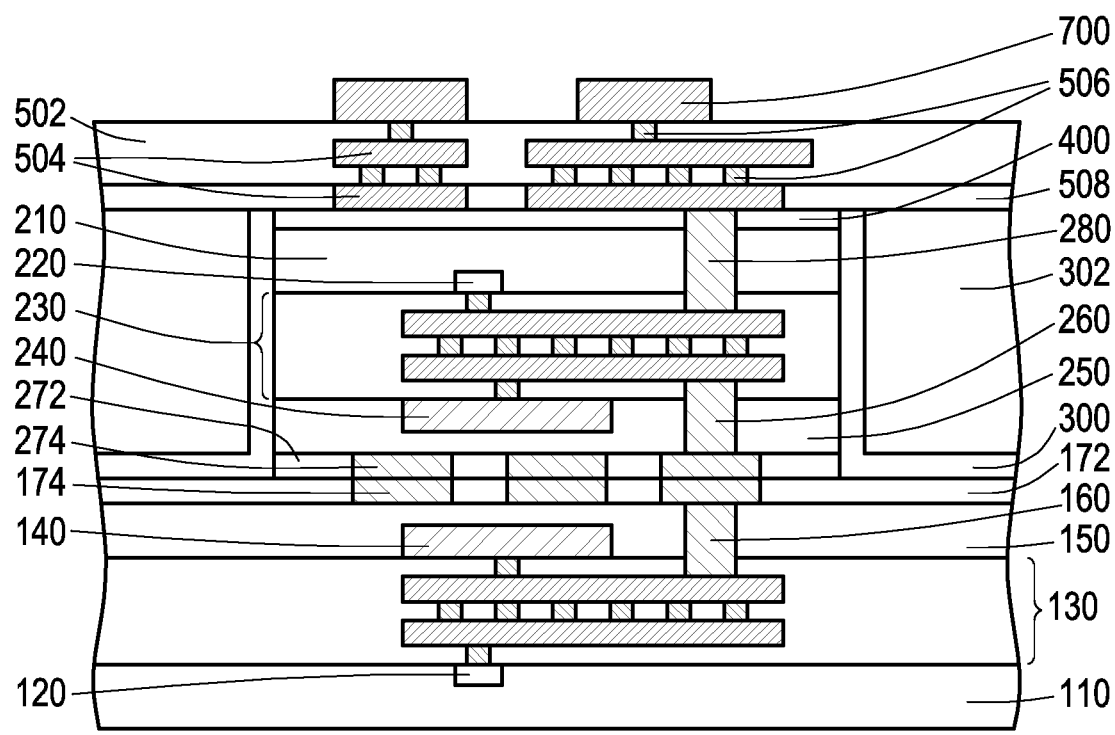

Referring to FIG. 1K, a plurality of bump pads 700 are formed over the redistribution structure 500. In some embodiments, the material of the bump pads 700 includes aluminum, titanium, copper, nickel, tungsten, or alloys thereof. In some embodiments, the material of the bump pads 700 are different from the conductive patterns 504 of the redistribution structure 500. For example, the conductive patterns 504 of the redistribution structure 500 may be made of copper while the bump pads 700 may be made of aluminum. However, the disclosure is not limited thereto. In some alternative embodiments, the material of the bump pads 700 may be the same as the material of the conductive patterns 504 of the redistribution structure 500. In some embodiments, the bump pads 700 may be formed by, for example, electroplating, deposition, and/or photolithography and etching. In some embodiments, the bump pads 700 are electrically connected with the conductive patterns 504 of the redistribution structure 500.

Figure 1L:
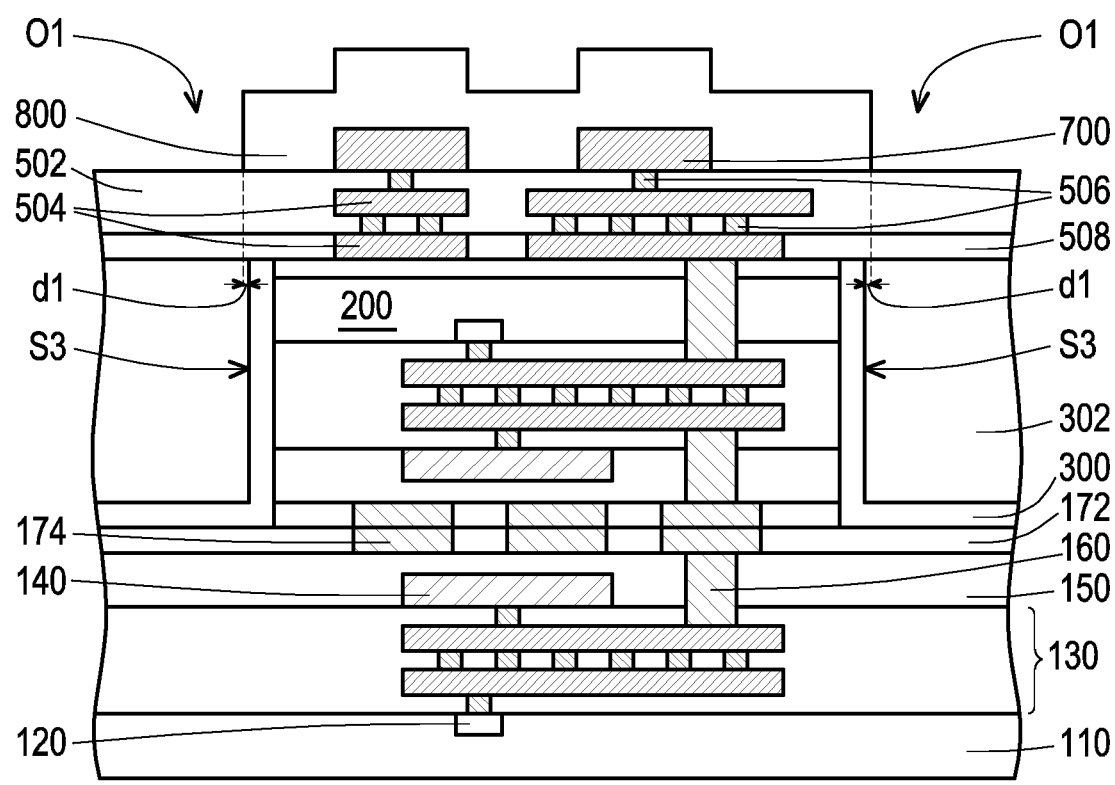

Referring to FIG. 1L, a patterned masking layer 800 is formed over the redistribution structure 500 and the bump pads 700. The patterned masking layer 800 comprises an opening pattern O1. In some embodiments, the opening pattern O1 exhibits a ring shape from the top view (not shown). In some embodiments, the patterned masking layer 800 is positive/negative photoresist, or a hardmask. In some embodiments, a process for forming the patterned masking layer 800 comprises depositing a masking layer (not shown) over the redistribution structure 500 and the bump pads 700. The masking layer may be deposited by, for example, CVD, PVD, ALD, a spin-coating process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer 800.

As shown in FIG. 1L, the opening pattern O1 of the patterned masking layer 800 overlies the redistribution structure 500. From another point of view, the opening pattern O1 of the patterned masking layer 800 overlies the encapsulant 302. In detail, as shown in FIG. 1L, the sidewall of the opening pattern O1 defined by the patterned masking layer 800 and the side surface S3 of the vertical portion of the etch stop layer 300 on the side surfaces of the die 200 have an offset d1. In some embodiments, the offset d1 ranges from greater than 0 μm to about 2 μm. However, the disclosure is not limited thereto. In some alternative embodiments, the sidewall of the opening pattern O1 defined by the patterned masking layer 800 is substantially aligned with the side surface S3 of the etch stop layer 300.

Figure 1M:
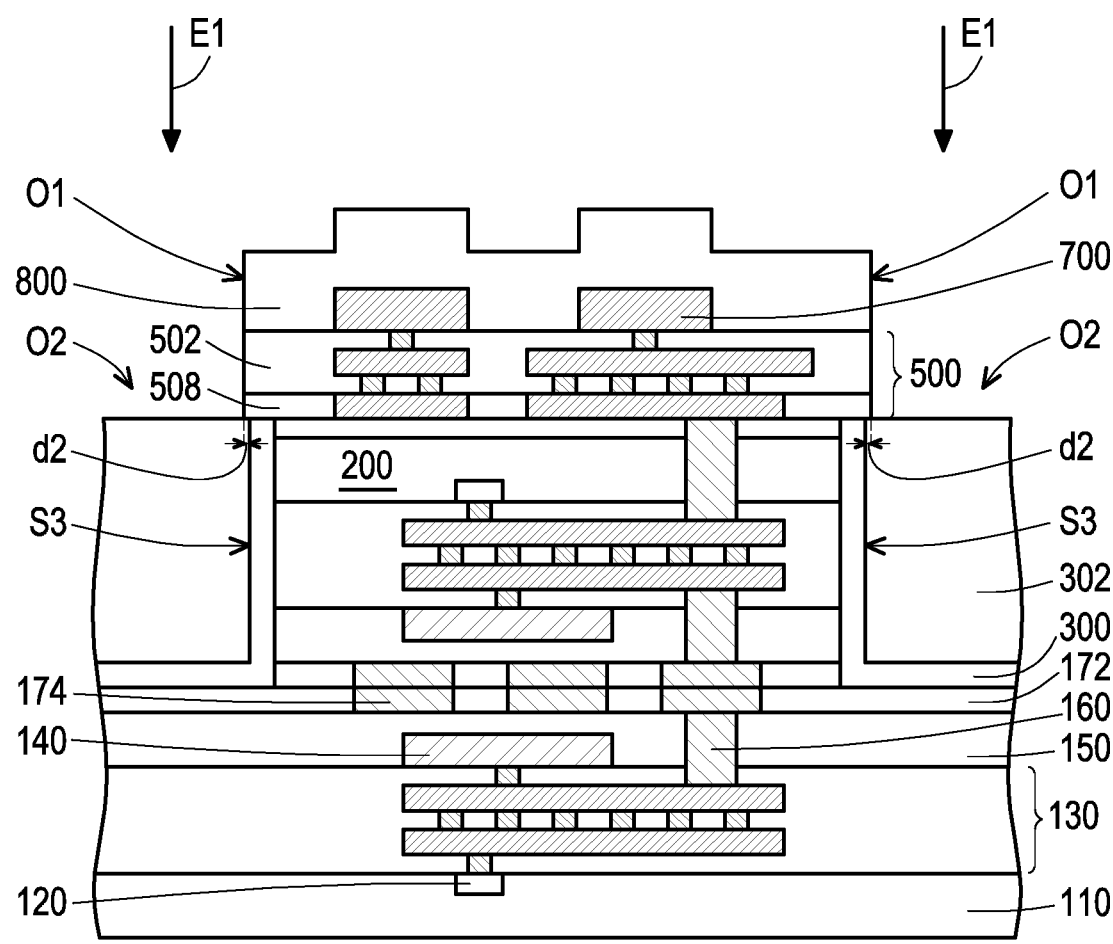

Referring to FIG. 1L and FIG. 1M, after the formation of the patterned masking layer 800, a first etching process E1 is performed on the redistribution structure 500 with the patterned masking layer 800 in place over the redistribution structure 500. That is to say, the first etching process E1 is performed using the patterned masking layer 800 as an etching mask. In detail, as shown in FIG. 1M, during the first etching process E1, the redistribution structure 500 is etched through the opening pattern O1 of the patterned masking layer 800 to formed an opening pattern O2. In some embodiments, the first etching process E1 is or comprises an anisotropic etching process. In some embodiments, the first etching process E1 is or comprises a dry etching process.

In some embodiments, the first etching process E1 for forming the opening pattern O2 comprises selectively etching the dielectric layer 502 of the redistribution structure 500 according to the patterned masking layer 800. In detail, the first etching process E1 removes a portion of the dielectric layer 502 that the opening pattern O1 overlies (e.g., unmasked portion of the dielectric layer 502) to exposed the underlying etch stop layer 508. As the first etching process E1 selectively etching off the unmasked portion of the dielectric layer 502, the underlying etch stop layer 508 is intact and not damaged. That is to say, during the first etching process E1, the material of the etch stop layer 508 has sufficient etching selectivity with respect to the material of the dielectric layer 502. Thereafter, the exposed etch stop layer 508 is selectively etched to form the opening pattern O2. In detail, the first etching process E1 further removes a portion of the etch stop layer 508 that the opening pattern O1 overlies (e.g., unmasked portion of the etch stop layer 508) to expose the underlying encapsulant 302. As the first etching process E1 selectively etching off the unmasked portion of the etch stop layer 508, the underlying encapsulant 302 is intact and not damaged. That is to say, during the first etching process E1, the material of the encapsulant 302 has sufficient etching selectivity with respect to the material of the etch stop layer 508. As such, by properly selecting etchants for the first etching process E1 and/or by properly selecting the materials of the dielectric layer 502, the etch stop layer 508 and the encapsulant 302, the redistribution structure 500 can be effectively etched to form the opening pattern O2. From another point of view, the first etching process E1 for forming the opening pattern O2 includes two etching steps (i.e., one etching step for the dielectric layer 502, and another etching step for the etch stop layer 508).

In some embodiments, since a location and a configuration of the opening pattern O2 are defined by the opening pattern O1, the opening pattern O2 also exhibits a ring shape from the top view (not shown). In some embodiments, the opening pattern O2 is arranged laterally surrounding the redistribution structure 500. In some embodiments, the opening pattern O2 overlies the encapsulant 302. In some embodiments, as shown in FIG. 1M, the sidewall of the opening pattern O2 defined by the redistribution structure 500 and the side surface S3 of the etch stop layer 300 have an offset d2. However, the disclosure is not limited thereto. In some alternative embodiments, the sidewall of the opening pattern O2 defined by the redistribution structure 500 is substantially aligned with the side surface S3 of the etch stop layer 300. In some embodiments, the offset d2 is the same as the offset d1. In some alternative embodiments, the offset d2 is different from the offset d1.

Figure 1N:
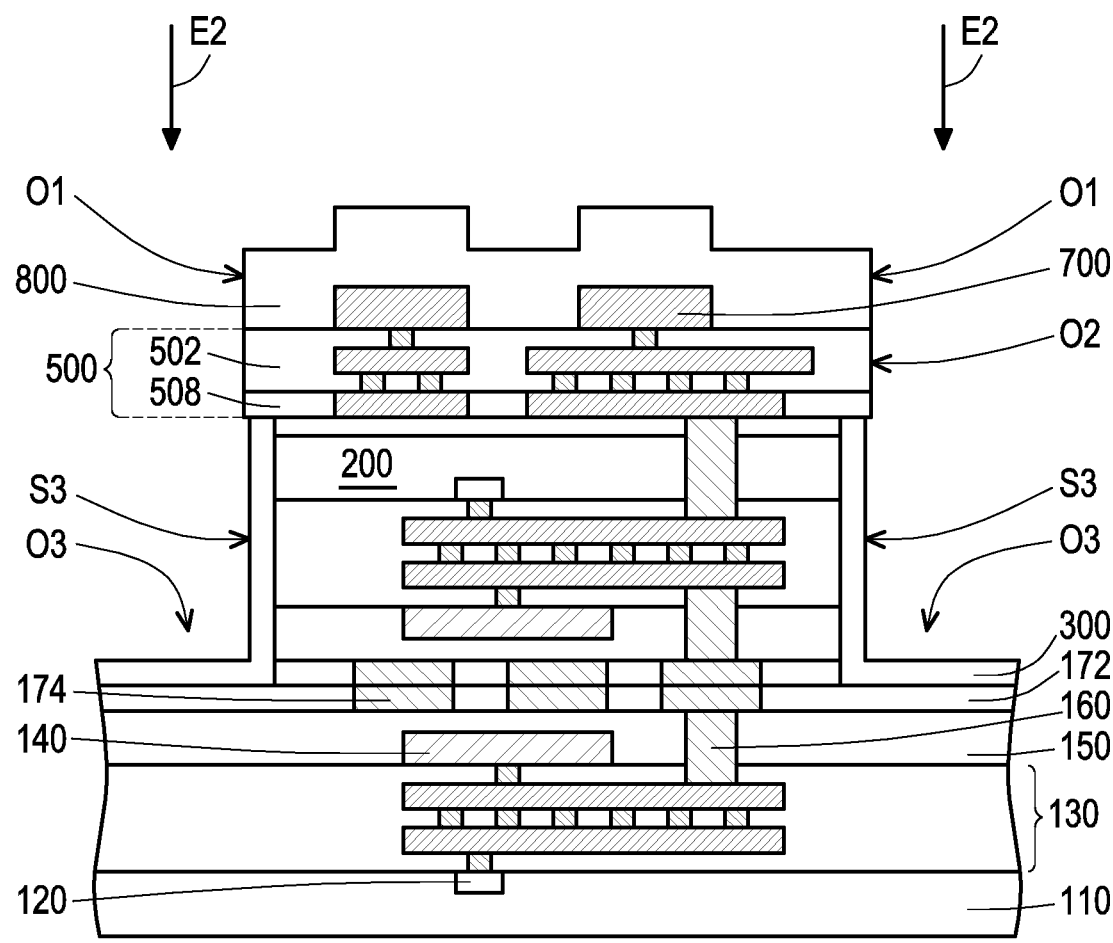
Figure 10:
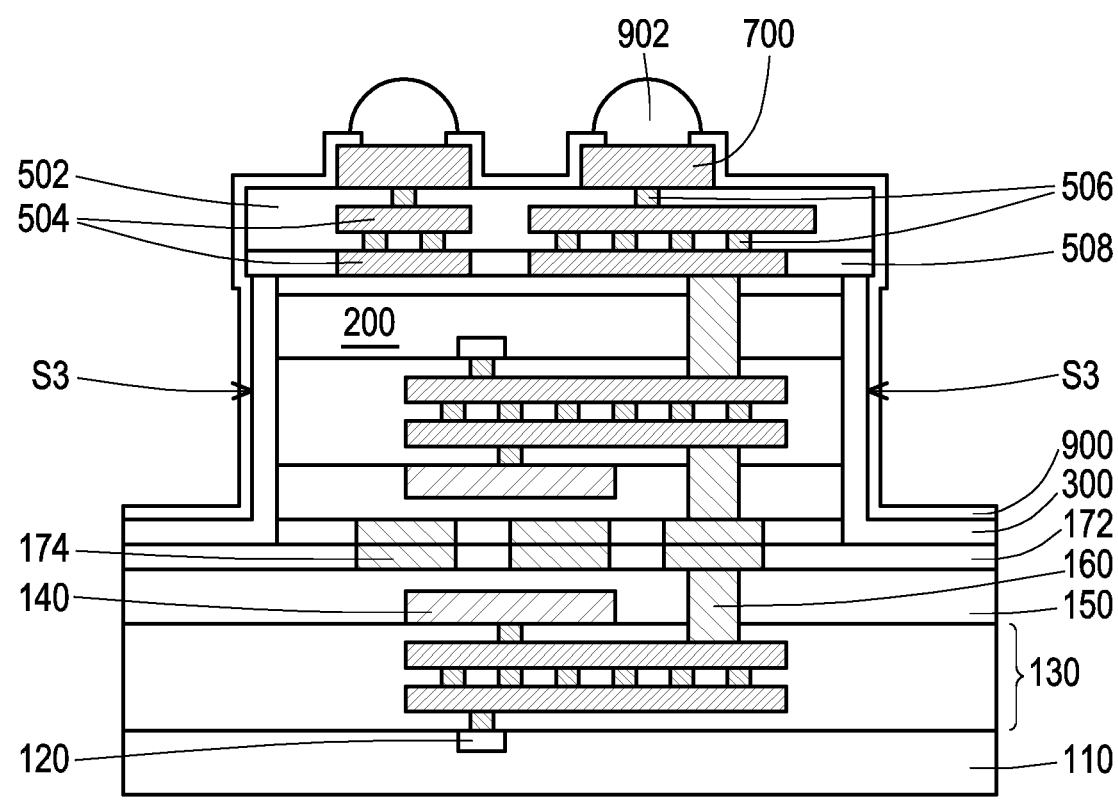

Referring to FIG. 1M and FIG. 1N, after the first etching process E1 is performed, a second etching process E2 is performed on the encapsulant 302 with the patterned masking layer 800 in place over the redistribution structure 500. That is to say, the second etching process E2 is performed using the patterned masking layer 800 as an etching mask. In detail, as shown in FIG. 1N, during the second etching process E2, the encapsulant 302 is etched through the opening pattern O1 of the patterned masking layer 800 to formed an opening pattern O3. From another point of view, during the second etching process E2, the redistribution structure 500 etched in the first etching process E1 can also act as an etching mask. That is to say, during the second etching process E2, the encapsulant 302 is also etched through the opening pattern O2. In some embodiments, the second etching process E2 is or comprises an isotropic etching process. In some embodiments, the second etching process E2 is or comprises a wet etching process.

In some embodiments, the second etching process E2 for forming the opening pattern O3 comprises selectively etching the encapsulant 302 according to the patterned masking layer 800 and the redistribution structure 500. In detail, as shown in FIG. 1N, the second etching process E2 removes the whole encapsulant 302 to form the opening pattern O3 exposing the underlying etch stop layer 300. As the second etching process E2 selectively etching off the encapsulant 302, the underlying etch stop layer 300 is intact and not damaged, while the encapsulant 302 is sufficiently removed without the presence of residue. That is to say, during the second etching process E2, the material of the etch stop layer 300 has sufficient etching selectivity with respect to the material of the encapsulant 302. As such, by properly selecting etchants for the second etching process E2 and/or by properly selecting the materials of the encapsulant 302 and the etch stop layer 300, the encapsulant 302 can be completely and sufficiently etched and removed to form the opening pattern O3. From another point of view, in some embodiments, since the second etching process E2 is or comprises an isotropic etching process, even there is the offset d2 (as shown in FIG. 1M) between the sidewall of the opening pattern O2 defined by the redistribution structure 500 and the side surface S3 of the etch stop layer 300, the portion of the encapsulant 302 directly underneath the redistribution structure 500 can be sufficiently removed without the presence of residue. From another point of view, after the encapsulant 302 is sufficiently removed without the presence of residue, a portion of the redistribution structure 500 is laterally protruded and suspended from the side surface S3 of the etch stop layer 300.

In some embodiments, since a location and a configuration of the opening pattern O3 are defined by the opening pattern O1 and the opening pattern O2, the opening pattern O3 also exhibits a ring shape from the top view (not shown). In some embodiments, the opening pattern O3 is arranged laterally surrounding the die 200. In some embodiments, the opening pattern O2 overlies the etch stop layer 300.

Referring to FIG. 1O, after the second etching process E2 is performed, the patterned masking layer 800 is removed. The patterned masking layer 800 may be removed through an etching process, a stripping process, an ashing process, a combination thereof, or the like.

Continued on FIG. 1O, a passivation layer 900 and a plurality of conductive terminals 902 are sequentially formed over the redistribution structure 500 and the bump pads 700. As shown in FIG. 1N and FIG. 1O, the passivation layer 900 is formed in the opening pattern O2 and opening pattern O3, and over the redistribution structure 500 and the bump pads 700. In detail, as shown in FIG. 1N and FIG. 1O, the passivation layer 900 is in directly contact with the etch stop layer 300 (e.g., the side surface S3), the sidewall of the opening pattern O2 defined by the redistribution structure 500 (i.e., the side surface of the redistribution structure 500), the top surface of the redistribution structure 500 (i.e., the top surface of the dielectric layer 502) and the side surface and top surface of each of the bump pads 700. From another point of view, the passivation layer 900 is laterally encapsulate the die 200 and the redistribution structure 500. In some embodiments, the material of the passivation layer 900 includes oxides, such as silicon oxide, or nitrides, such as silicon nitride. Alternatively, the passivation layer 900 may include polyimide, epoxy resin, acrylic resin, phenol resin, BCB, PBO, or any other suitable polymer-based dielectric material. The passivation layer 900, for example, may be formed by suitable fabrication techniques, such as a spin-coating process, CVD, PECVD, or the like. In some embodiments, the passivation layer 900 is formed to expose at least a portion of each of the bump pads 700. In some embodiments, as shown in FIG. 1O, the passivation layer 900 is a single layer. However, the disclosure is not limited thereto. In some alternative embodiments, the passivation layer 900 has a multi-layer structure.

As illustrated in FIG. 1O, the conductive terminals 902 are formed on the exposed portions of the bump pads 700. In some embodiments, a plurality of under-bump metallurgy (UBM) patterns (not shown) may be optionally provided between the conductive terminals 902 and the bump pads 700. In some embodiments, the conductive terminals 902 are attached to the bump pads 700 (or the UBM patterns, if present) through a solder flux. In some embodiments, the conductive terminals 902 are, for example, solder balls, ball grid array (BGA) balls, or controlled collapse chip connection (C4) bumps. In some embodiments, the conductive terminals 902 are made of a conductive material with low resistivity, such as Sn, Pb, Ag, Cu, Ni, Bi, or an alloy thereof.

After the conductive terminals 902 are formed, a singulation process is performed to form a plurality of packages 10. As mentioned, the manufacturing process described above is part of a wafer level packaging process, although one singulated package 10 is shown in FIG. 1O, those skilled in the art should understand that plural package 10 are obtained after the singulation process. In some embodiments, the singulation process is performed to cut through the passivation layer 900, the etch stop layer 300 and the wafer substrate WS, as shown in FIG. 1N and FIG. 1O. For example, the passivation layer 900, the etch stop layer 300 and the wafer substrate WS are cut through to form a coterminous sidewall of the package 10. In detail, as shown in FIG. 1O, the resulted coterminous sidewall includes the singulated outer sidewall of the passivation layer 900, the singulated outer sidewall of the etch stop layer 300 and the singulated outer sidewall of the wafer substrate WS that are substantially aligned with one another. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, during the singulation process, the wafer substrate WS is divided into a plurality of dies 100. That is, each die 100 includes the semiconductor substrate 110, the device 120, the interconnection structure 130, the conductive pad 140, the passivation layer 150, the bonding via 160, and the bonding layer 170.

As illustrated in FIG. 1O, in the package 10, the die 200 is stacked on and bonded to the die 100. In other words, multiple dies 100 and 200 are integrated into a single package 10. As such, the package 10 may be referred to as a "system on integrated circuit (SOIC) package." As illustrated in FIG. 1O, in the package 10, the passivation layer 900 is in directly contact with the underlying etch stop layer 300, the side surface and top surface of the redistribution structure 500, and the side surface and top surface of each of the bump pads 700. That is to say, in the package 10, the side surface of the redistribution structure 500 is in directly contact with a dielectric structure. It is noted that since the encapsulant 302 (i.e., the gap fill oxide) is sufficiently removed without the presence of residue during the second etching process E2, the issue of cracking defect in the gap fill oxide can be eliminated, and thereby the reliability of the package 10 is improved.

FIG. 2A to FIG. 2F are schematic cross-sectional views illustrating a manufacturing process of a package 20 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein. The differences between the manufacturing process of the package 20 and the manufacturing process of the package 10 will be described below.

Figure 2A:
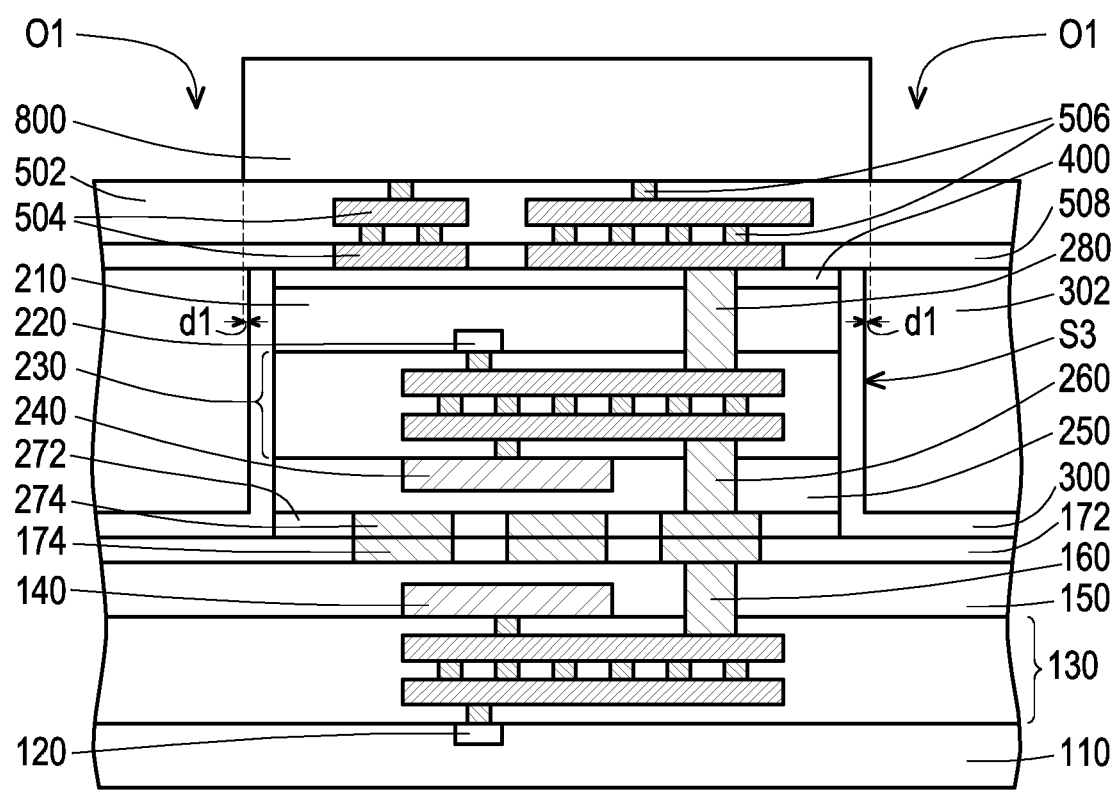
FIG. 2A to FIG. 2F are schematic cross-sectional views illustrating a manufacturing process of a package in accordance with some alternative embodiments of the disclosure.

Referring to FIG. 2A, a structure same as the structure of FIG. 1J is provided. Details or descriptions (e.g., the materials, formation processes, positioning configurations, etc.) of the wafer substrate WS, the die 200, the etch stop layer 300, the encapsulant 302, the protection layer 400 and the redistribution structure 500 have been described in conjunction with FIG. 1A to FIG. 1J above, and will not be iterated herein again. Accordingly, for details or descriptions of the wafer substrate WS, the die 200, the etch stop layer 300, the encapsulant 302, the protection layer 400 and the redistribution structure 500 not iterated herein, please refer to the aforesaid embodiments.

Continued on FIG. 2A, the patterned masking layer 800 is formed over the redistribution structure 500. That is to say, in the manufacturing process of the package 20, the patterned masking layer 800 is formed before the formation of the bump pads 700. Details or descriptions (e.g., the materials, formation processes, positioning configurations, etc.) of the patterned masking layer 800 have been described in conjunction with FIG. 1L above, and will not be iterated herein again. Accordingly, for details or descriptions of the patterned masking layer 800 not iterated herein, please refer to the aforesaid embodiments.

Figure 2B:
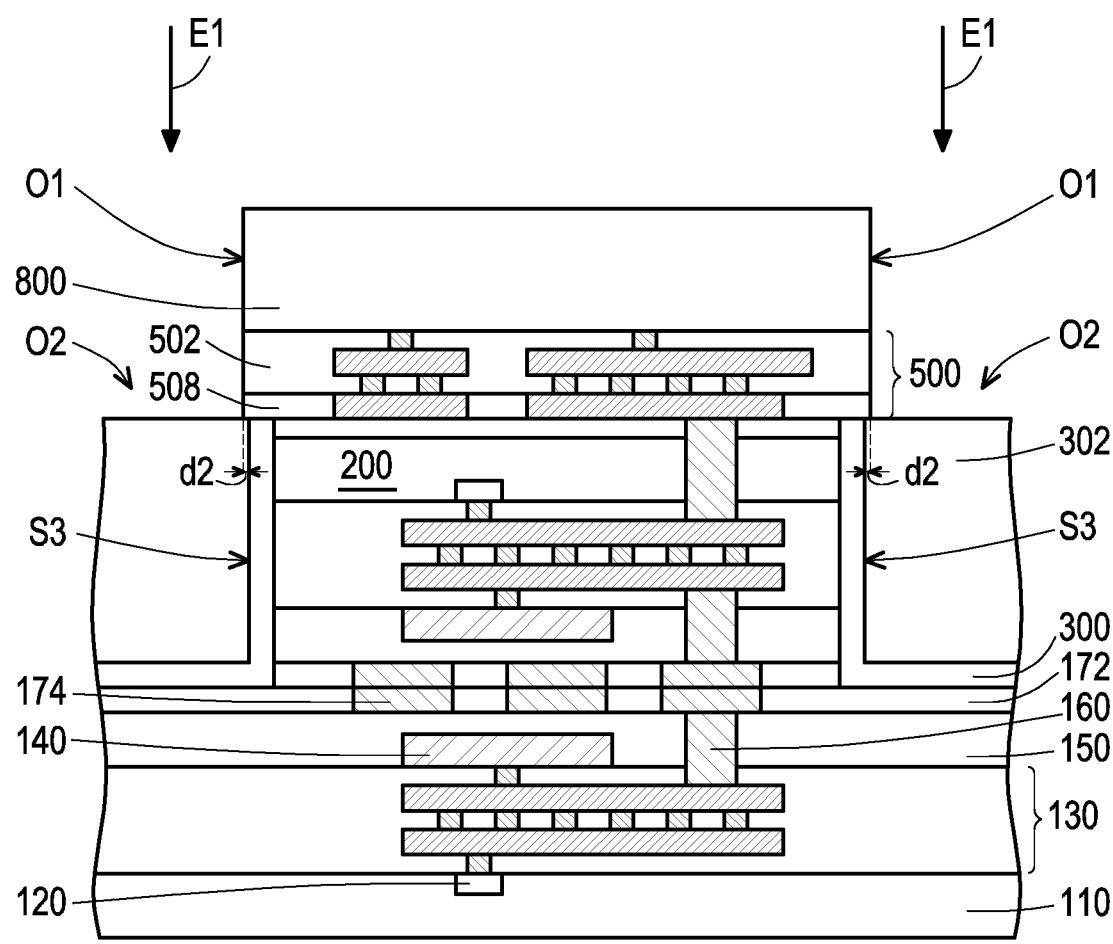

Referring to FIG. 2A and FIG. 2B, the first etching process E1 is performed on the redistribution structure 500 with the patterned masking layer 800 in place over the redistribution structure 500, so as to form the opening pattern O2. Process details or descriptions of the first etching process E1 have been described in conjunction with FIG. 1L and FIG. 1M above, and will not be iterated herein again. Also, details or descriptions (e.g., the formation processes, positioning configurations, etc.) of the opening pattern O2 have been described in conjunction with FIG. 1L and FIG. 1M above, and will not be iterated herein again. Accordingly, for details or descriptions of the first etching process E1 and the opening pattern O2 not iterated herein, please refer to the aforesaid embodiments.

Figure 2C:
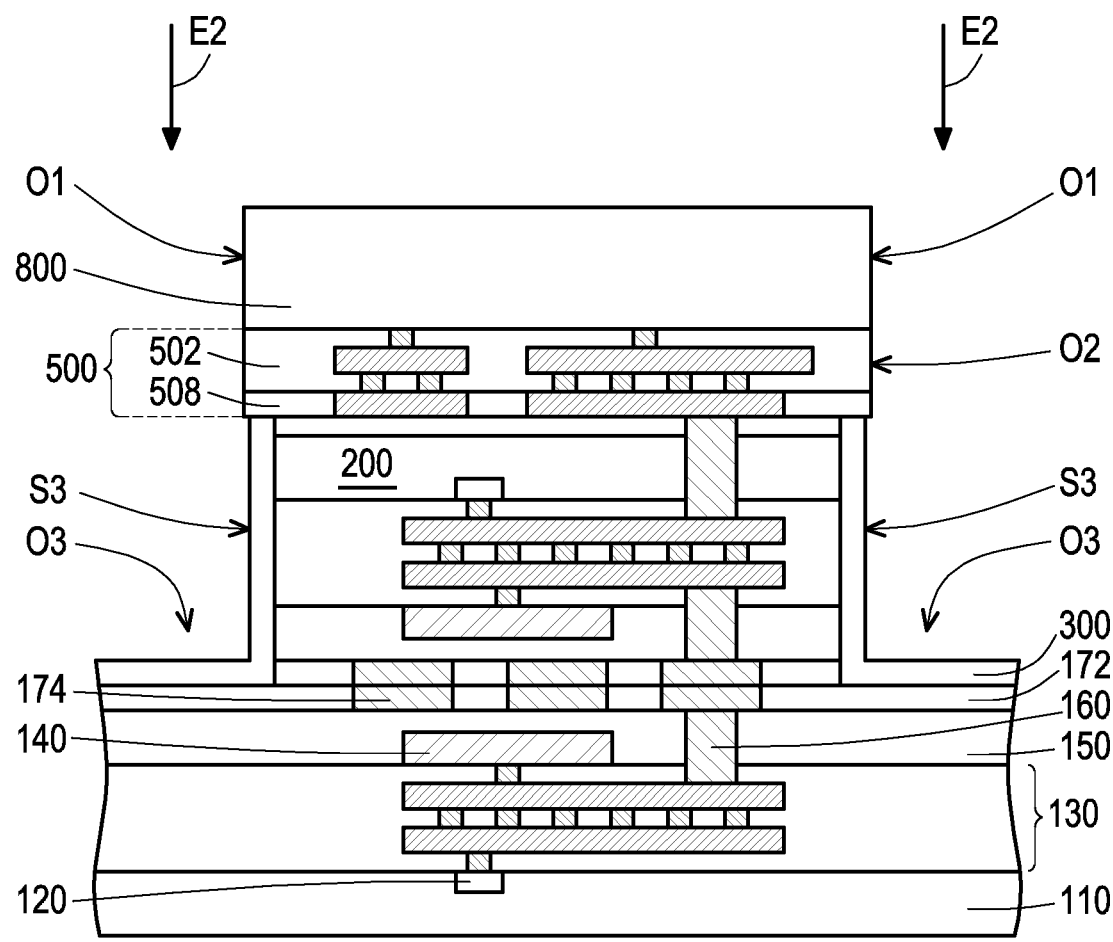

Referring to FIG. 2B and FIG. 2C, after the first etching process E1 is performed, the second etching process E2 is performed on the encapsulant 302 with the patterned masking layer 800 in place over the redistribution structure 500, so as to sufficiently remove the encapsulant 302 and form the opening pattern O3. Process details or descriptions of the second etching process E2 have been described in conjunction with FIG. 1M and FIG. 1N above, and will not be iterated herein again. Also, details or descriptions (e.g., the formation processes, positioning configurations, etc.) of the opening pattern O3 have been described in conjunction with FIG. 1M and FIG. 1N above, and will not be iterated herein again. Accordingly, for details or descriptions of the second etching process E2 and the opening pattern O3 not iterated herein, please refer to the aforesaid embodiments.

Figure 2D:
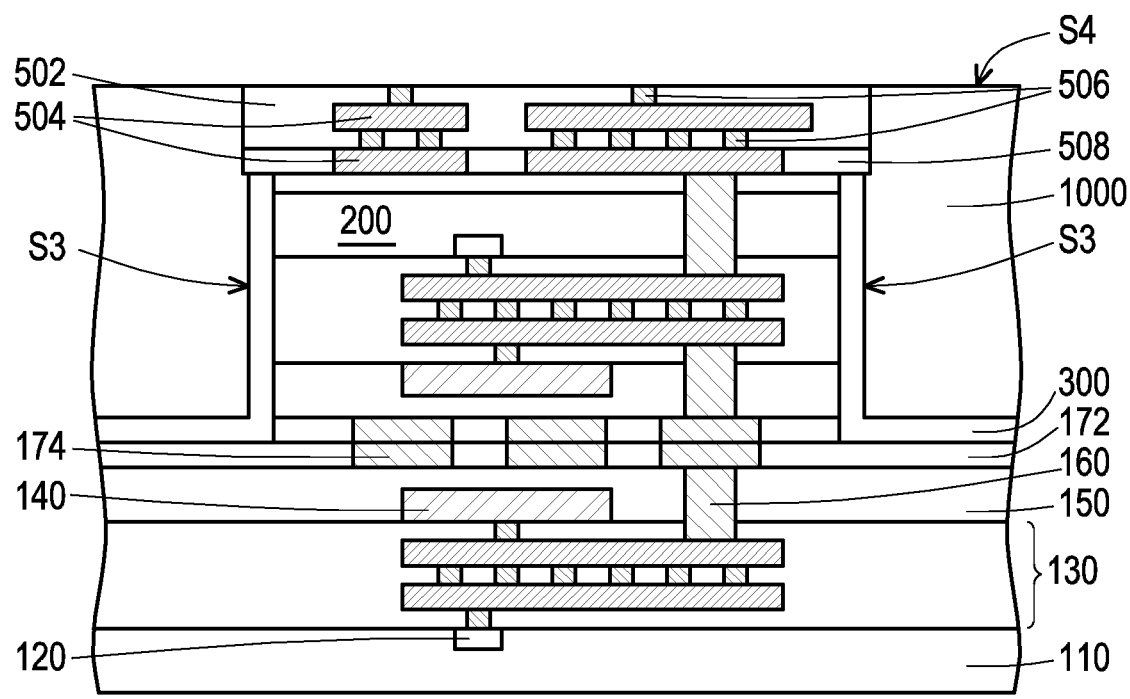

Referring to FIG. 2D, after the second etching process E2 is performed, the patterned masking layer 800 is removed. The patterned masking layer 800 may be removed through an etching process, a stripping process, an ashing process, a combination thereof, or the like.

Continued on FIG. 2D, an encapsulant 1000 is formed over the wafer substrate WS to laterally encapsulate the die 200 and the redistribution structure 500. In detail, as shown in FIG. 2C and FIG. 2D, the encapsulant 1000 is in directly contact with the etch stop layer 300 (e.g., the side surface S3), and the sidewall of the opening pattern O2 defined by the redistribution structure 500 (i.e., the side surface of the redistribution structure 500). As shown in FIG. 2D, the etch stop layer 300 is disposed between the die 200 and the encapsulant 1000, and between the wafer substrate WS and the encapsulant 1000. In some embodiments, the encapsulant 1000 may be formed by the following steps. First, an encapsulation material layer (not shown) is formed over the etch stop layer 300 to encapsulate the die 200 and the redistribution structure 500. At this stage, the conductive vias 506 at the top surface of the redistribution structure 500 and the dielectric layer 502 are not revealed and are well protected by the encapsulation material layer. In some embodiments, the encapsulation material layer may be formed by a molding process (such as a compression molding process). In some embodiments, the encapsulation material layer includes or is molding compound or molded underfill. That is to say, the material of the encapsulant 1000 is different from the material of the encapsulant 300 (i.e., the gap fill oxide). After the encapsulation material layer is formed, the encapsulation material layer is thinned until the conductive vias 506 at the top surface of the redistribution structure 500 and the dielectric layer 502 are exposed, so as to form the encapsulant 1000 aside the die 200 and the redistribution structure 500. In some embodiments, the encapsulation material layer may be thinned or planarized through a grinding process, such as a mechanical grinding process, a CMP process, or the like. After the removal process, as illustrated in FIG. 2D, the illustrated top surface S4 of the encapsulant 1000 is substantially coplanar or flush with the top surface of the redistribution structure 500. In some embodiments, the encapsulant 1000 further includes fillers. Alternatively, the encapsulant 1000 may be free of fillers.

Figure 2E:
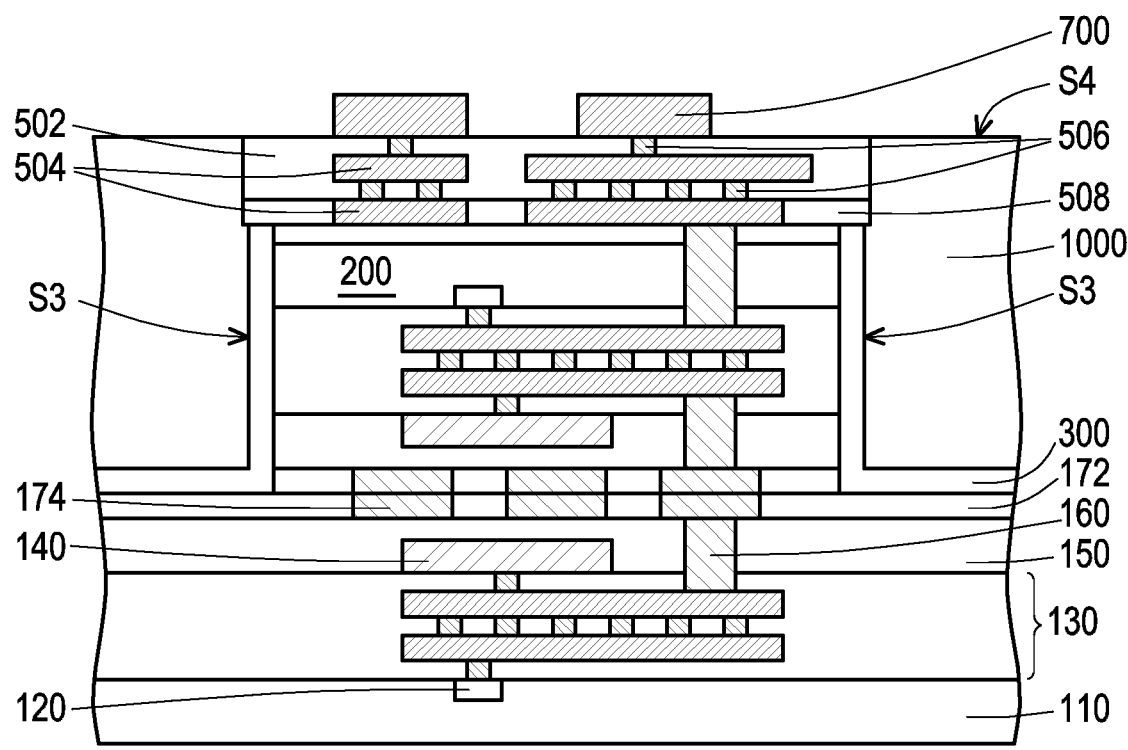

Referring to FIG. 2E, after the encapsulant 1000 is formed, the bump pads 700 are formed over the redistribution structure 500. Details or descriptions (e.g., the materials, formation processes, positioning configurations, etc.) of the bump pads 700 have been described in conjunction with FIG. 1K above, and will not be iterated herein again. Accordingly, for details or descriptions of the bump pads 700 not iterated herein, please refer to the aforesaid embodiments.

Figure 2F:
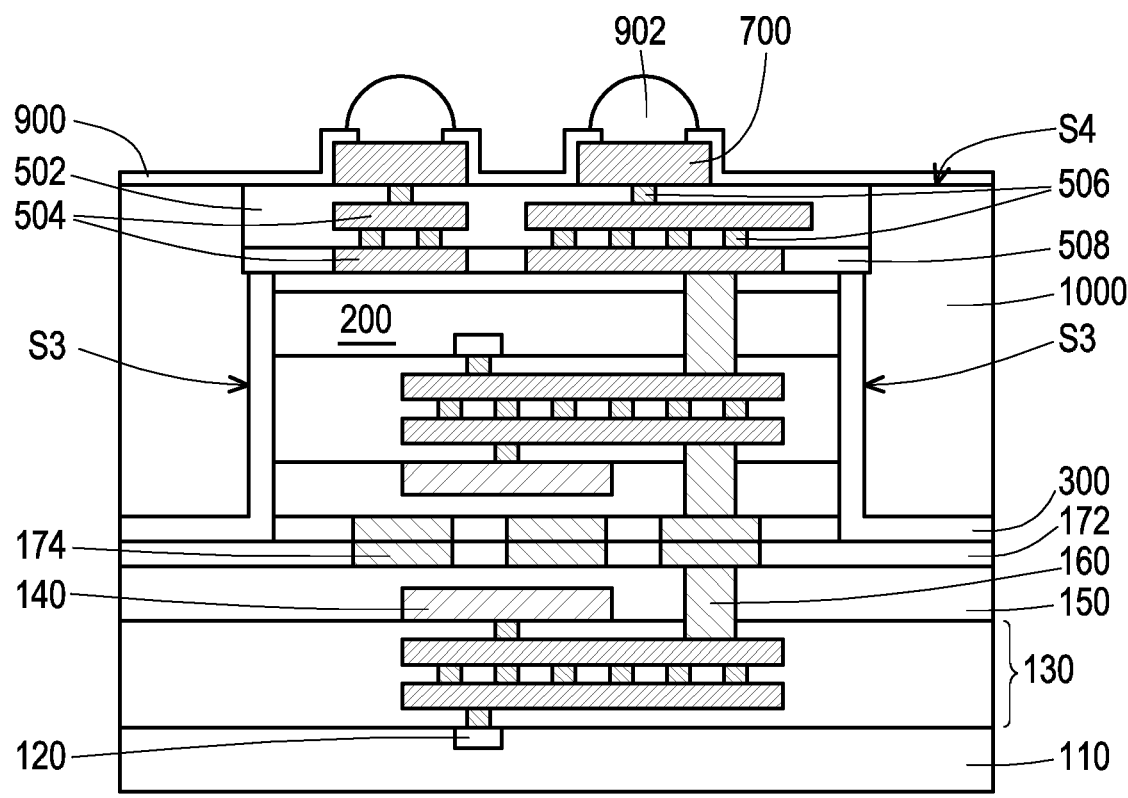

Referring to FIG. 2F, after the bump pads 700 are formed, the passivation layer 900 and the conductive terminals 902 are sequentially formed over the encapsulant 1000, the redistribution structure 500 and the bump pads 700. In detail, the passivation layer 900 is in directly contact with the top surface S4 of the encapsulant 1000, and the side surface and top surface of each of the bump pads 700. Details or descriptions (e.g., the materials, formation processes, positioning configurations, etc.) of the passivation layer 900 and the conductive terminals 902 have been described in conjunction with FIG. 1O above, and will not be iterated herein again. Accordingly, for details or descriptions of the passivation layer 900 and the conductive terminals 902 not iterated herein, please refer to the aforesaid embodiments.

After the conductive terminals 902 are formed, a singulation process is performed to form a plurality of packages 20. As mentioned, the manufacturing process described above is part of a wafer level packaging process, although one singulated package 20 is shown in FIG. 2F, those skilled in the art should understand that plural package 20 are obtained after the singulation process. In some embodiments, the singulation process is performed to cut through the passivation layer 900, the encapsulant 1000, the etch stop layer 300 and the wafer substrate WS, as shown in FIG. 2E and FIG. 2F. For example, the passivation layer 900, the encapsulant 1000, the etch stop layer 300 and the wafer substrate WS are cut through to form a coterminous sidewall of the package 20. In detail, as shown in FIG. 2F, the resulted coterminous sidewall includes the singulated outer sidewall of the passivation layer 900, the singulated outer sidewall of the encapsulant 1000, the singulated outer sidewall of the etch stop layer 300 and the singulated outer sidewall of the wafer substrate WS that are substantially aligned with one another. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, during the singulation process, the wafer substrate WS is divided into the dies 100.

As illustrated in FIG. 2F, in the package 20, the die 200 is stacked on and bonded to the die 100. In other words, multiple dies 100 and 200 are integrated into a single package 20. As such, the package 20 may be referred to as a "system on integrated circuit (SOIC) package." As illustrated in FIG. 2F, in the package 20, the encapsulant 1000 is in directly contact with the underlying etch stop layer 300, and the side surface of the redistribution structure 500. That is to say, in the package 20, the side surface of the redistribution structure 500 is in directly contact with a dielectric structure. It is noted that since the encapsulant 302 (i.e., the gap fill oxide) is sufficiently removed without the presence of residue during the second etching process E2 and is replaced with the encapsulant 1000 in the subsequent step, the issue of cracking defect in the gap fill oxide can be eliminated, and thereby the reliability of the package 20 is improved.

As shown in FIG. 1O and FIG. 2F, in the package 10 and package 20, one die 200 is stacked on the die 100. However, the disclosure is not limited thereto. In some alternative embodiments, more than one die 200 may be formed and stacked over the die 100. For example, the more than one die 200 may be stacked with each other over the die 100. For another example, the more than one die 200 stacked on the die 100 may be arranged side by side.

Figure 3:
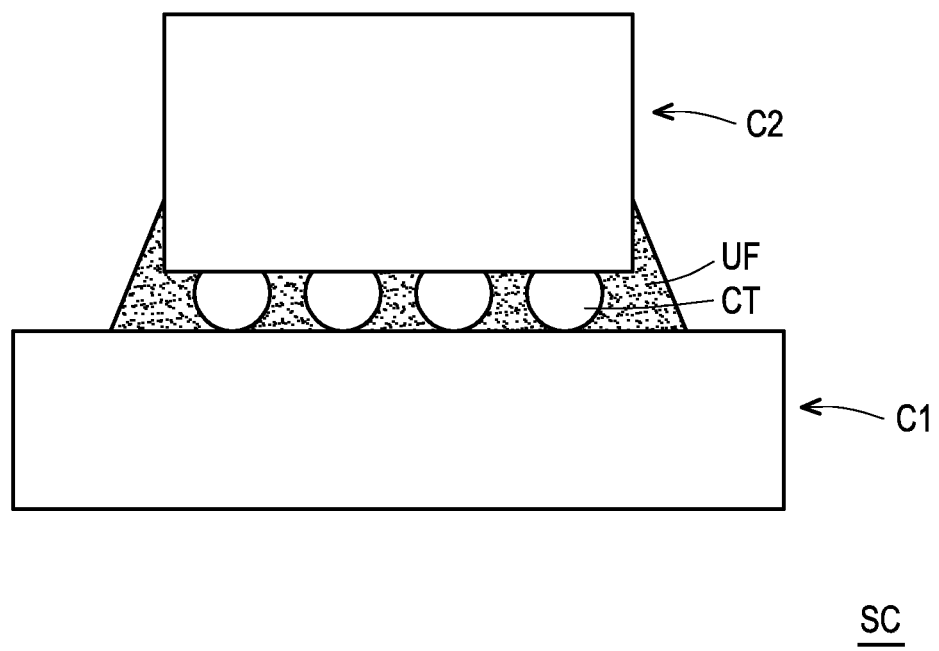
FIG. 3 is a schematic cross-sectional view showing an application of a semiconductor structure in accordance with some embodiments of the disclosure.

FIG. 3 is a schematic cross-sectional view showing an application of a semiconductor structure in accordance with some embodiments of the disclosure. Referring to FIG. 3, a component assembly SC including a first component C1 and a second component C2 disposed over the first component C1 is provided. The first component C1 may be or may include a package substrate, a printed circuit board (PCB), a printed wiring board, and/or other carrier that is capable of carrying integrated circuits. In some embodiments, the second component C2 mounted on the first component C1 is similar to one of the packages 10 to 20 described above. For example, one of the packages 10 to 20 may be electrically coupled to the first component C1 through a plurality of terminals CT. The terminals CT may be the conductive terminals 902 described above. In some embodiments, an underfill layer UF is formed between the space of the first component C1 and the second component C2 to at least laterally cover the terminals CT. Alternatively, the underfill layer UF is omitted.

Other packaging techniques may be used to form the component assembly SC, which are not limited in the disclosure. For example, the component assembly SC is formed using a wafer level packaging (WLP), a chip-on-wafer-on-substrate (CoWoS) process, a chip-on-chip-on-substrate (CoCoS) process, etc. The component assembly SC may be a part of an electronic system for such as computers (e.g., high-performance computer), computational devices used in conjunction with an artificial intelligence system, wireless communication devices, computer-related peripherals, entertainment devices, etc. The component assembly SC including the semiconductor structure(s) discussed herein may provide high bandwidth data communication. It should be noted that other electronic applications are also possible.

In accordance with an embodiment, a manufacturing method of a package includes: providing a wafer substrate having first bonding pads; placing a die on the wafer substrate, wherein the die comprises second bonding pads bonded to the first bonding pads; encapsulating the die by an etch stop layer and a first encapsulant; forming a redistribution structure over the die, the etch stop layer and the first encapsulant; removing a portion of the redistribution structure to expose the first encapsulant; removing the first encapsulant to expose the etch stop layer; and forming a dielectric structure over the exposed etch stop layer and laterally encapsulating the die and the redistribution structure.

In accordance with an embodiment, a manufacturing method of a package includes: providing a wafer substrate; bonding a die to the wafer substrate; encapsulating the die by a first etch stop layer and a first encapsulant; forming a redistribution structure over the die, the first etch stop layer and the first encapsulant, and electrically connected with the die; performing a first etching process to partially remove the redistribution structure to form a first opening pattern exposing the first encapsulant; performing a second etching process using the etched redistribution structure as an etching mask to remove the first encapsulant to form a second opening pattern exposing the first etch stop layer; and forming a dielectric structure in the first opening pattern and the second opening pattern, and laterally encapsulate the die and the redistribution structure.

In accordance with an embodiment, a package includes: a first die; a second die stacked on and bonded to the first die; a redistribution structure over the second die; and a dielectric structure aside the second die and the redistribution structure, wherein the dielectric structure is in contact with a side surface of the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a package, comprising:
   providing a wafer substrate having first bonding pads;
   placing a die on the wafer substrate, wherein the die comprises second bonding pads bonded to the first bonding pads;
   encapsulating the die by an etch stop layer and a first encapsulant;
   forming a redistribution structure over the die, the etch stop layer and the first encapsulant;
   removing a portion of the redistribution structure to expose the first encapsulant;
   removing the first encapsulant to expose the etch stop layer; and
   forming a dielectric structure over the exposed etch stop layer and laterally encapsulating the die and the redistribution structure.

2. The method of claim 1, wherein the portion of the redistribution structure is removed by performing a dry etching process.

3. The method of claim 1, wherein the first encapsulant is removed by performing a wet etching process.

4. The method of claim 1, further comprising:
   forming conductive pads over the redistribution structure; and
   forming conductive terminals over the conductive pads.

5. The method of claim 4, wherein the dielectric structure comprises a passivation layer over the redistribution structure and the conductive pads, and in contact with the conductive terminals.

6. The method of claim 5, wherein the conductive pads are formed before the portion of the redistribution structure is removed.

7. The method of claim 4, wherein the dielectric structure comprises a second encapsulant, and a material of the second encapsulant is different from a material of the first encapsulant.

8. The method of claim 7, wherein the second encapsulant is formed by a molding process.

9. The method of claim 7, wherein the conductive pads are formed after the portion of the redistribution structure is removed.

10. The method of claim 7, further comprising:
    forming a passivation layer over the second encapsulant, the redistribution structure and the conductive pads, and in contact with the conductive terminals.

11. A manufacturing method of a package, comprising:
    providing a wafer substrate;
    bonding a die to the wafer substrate;
    encapsulating the die by a first etch stop layer and a first encapsulant;
    forming a redistribution structure over the die, the first etch stop layer and the first encapsulant, and electrically connected with the die;
    performing a first etching process to partially remove the redistribution structure to form a first opening pattern exposing the first encapsulant;
    performing a second etching process using the etched redistribution structure as an etching mask to remove the first encapsulant to form a second opening pattern exposing the first etch stop layer; and forming a dielectric structure in the first opening pattern and the second opening pattern, and laterally encapsulate the die and the redistribution structure.

12. The method of claim 11, wherein the redistribution structure is form to comprise a second etch stop layer in contact with the first etch stop layer and the first encapsulant; and a dielectric layer on the second etch stop layer.

13. The method of claim 12, wherein the first etching process for forming the first opening pattern comprises:
- a first etching step of partially removing the dielectric layer of the redistribution structure, while remaining the second etch stop layer intact; and
- a second etching step of partially removing the second etch stop layer to form the first opening pattern.

14. The method of claim 11, wherein the second etching process for forming the second opening pattern comprises: completely removing the first encapsulant without the presence of residue, while remaining the first etch stop layer intact.

15. The method of claim 11, wherein a sidewall of the first opening pattern defined by the redistribution structure and an outer side surface of a vertical portion of the first etch stop layer on the die have an offset.

16. The method of claim 11, further comprising:
forming conductive pads over the redistribution structure;
forming a passivation layer over the dielectric structure, the redistribution structure and the conductive pads; and
forming conductive terminals over the conductive pads and the passivation layer.

17. The method of claim 16, further comprising:
performing a singulation process to cut through the passivation layer, the dielectric structure, the first etch stop layer and the wafer substrate.

18. A manufacturing method of a package, comprising:
providing a wafer substrate;
bonding a die to the wafer substrate;
forming a etch stop layer and a first encapsulant laterally surrounding the die;
forming a redistribution structure over the etch stop layer and the first encapsulant, and electrically connected with the die;
forming a masking layer on the redistribution structure;
patterning the redistribution structure using the masking layer as a mask to expose the first encapsulant;
removing the first encapsulant to expose the etch stop layer; and
forming a dielectric structure over the exposed etch stop layer and laterally surrounding the die and the redistribution structure.

19. The method of claim 18, wherein the masking layer is removed before the dielectric structure is formed.

20. The method of claim 18, wherein the dielectric structure is formed to have a top surface substantially coplanar with a top surface of the redistribution structure.

* * * * *